(12) United States Patent
Aleksov et al.

(10) Patent No.: US 11,621,192 B2
(45) Date of Patent: Apr. 4, 2023

(54) INORGANIC DIES WITH ORGANIC INTERCONNECT LAYERS AND RELATED STRUCTURES

(71) Applicant: Intel Corporation, Santa Clara, CA (US)

(72) Inventors: Aleksandar Aleksov, Chandler, AZ (US); Feras Eid, Chandler, AZ (US); Telesphor Kamgaing, Chandler, AZ (US); Georgios Dogiamis, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 17/338,296

(22) Filed: Jun. 3, 2021

(65) Prior Publication Data

US 2021/0296175 A1    Sep. 23, 2021

Related U.S. Application Data

(63) Continuation of application No. 16/721,235, filed on Dec. 19, 2019, now Pat. No. 11,062,947.

(51) Int. Cl.
*H01L 21/768*  (2006.01)
*H01L 23/00*  (2006.01)

(52) U.S. Cl.
CPC .. *H01L 21/76898* (2013.01); *H01L 21/76838* (2013.01); *H01L 24/13* (2013.01); *H01L 2224/73253* (2013.01); *H01L 2924/14* (2013.01)

(58) Field of Classification Search
CPC .............. H01L 21/76898; H01L 24/13; H01L 21/76838; H01L 2224/73253; H01L 2924/14
See application file for complete search history.

(56) References Cited

U.S. PATENT DOCUMENTS

| | | | | |
|---|---|---|---|---|
| 6,130,472 | A | * | 10/2000 | Feger .................... H01L 23/564 257/E23.002 |
| 8,933,473 | B1 | * | 1/2015 | Dubin ............... H01L 21/67703 257/79 |
| 9,992,859 | B2 | | 6/2018 | Elsherbini et al. |
| 2003/0108664 | A1 | * | 6/2003 | Kodas .............. H01C 17/06573 257/E21.174 |
| 2011/0095272 | A1 | * | 4/2011 | Ng ..................... H01L 27/11507 257/295 |

(Continued)

*Primary Examiner* — Mamadou L Diallo
(74) *Attorney, Agent, or Firm* — Akona IP PC

(57) ABSTRACT

Disclosed herein are methods to fabricate inorganic dies with organic interconnect layers and related structures and devices. In some embodiments, an integrated circuit (IC) structure may be formed to include an inorganic die and one or more organic interconnect layers on the inorganic die, wherein the organic interconnect layers include an organic dielectric. An example method includes forming organic interconnect layers over an inorganic interconnect substrate and forming passive components in the organic interconnect layer. The organic interconnect layers comprise a plurality of conductive metal layers through an organic dielectric material. The plurality of conductive metal layers comprises electrical pathways. the passive components are electrically coupled to the electrical pathways.

20 Claims, 27 Drawing Sheets

(56) References Cited

U.S. PATENT DOCUMENTS

| | | | |
|---|---|---|---|
| 2012/0280381 A1* | 11/2012 | Beyne | H01L 23/562 |
| | | | 257/680 |
| 2016/0299228 A1* | 10/2016 | Maleki | G01S 17/89 |
| 2018/0019197 A1* | 1/2018 | Boyapati | H01L 23/5383 |
| 2018/0323492 A1* | 11/2018 | Daniel | H01Q 1/1271 |
| 2019/0157233 A1* | 5/2019 | Fillion | H01L 24/20 |
| 2019/0221447 A1* | 7/2019 | Chavali | H01L 23/49827 |
| 2019/0273197 A1* | 9/2019 | Roberts | G06N 10/00 |
| 2019/0311980 A1* | 10/2019 | Eid | H01L 23/49866 |
| 2019/0385977 A1* | 12/2019 | Elsherbini | H01L 24/92 |
| 2020/0083170 A1* | 3/2020 | Cheah | H01L 23/5386 |
| 2020/0211949 A1* | 7/2020 | Strong | H01L 21/561 |
| 2020/0219861 A1* | 7/2020 | Kamgaing | H03H 9/0561 |
| 2020/0235716 A1* | 7/2020 | Eid | H03H 9/0557 |
| 2020/0243450 A1* | 7/2020 | Cho | H01L 23/49822 |
| 2020/0294901 A1* | 9/2020 | Strong | H01L 21/481 |
| 2021/0028061 A1* | 1/2021 | Farooq | H01L 21/76877 |

\* cited by examiner

INORGANIC DIES WITH ORGANIC INTERCONNECT LAYERS AND RELATED STRUCTURES

CROSS-REFERENCE TO RELATED APPLICATIONS

This application is a continuation of U.S. patent application Ser. No. 16/721,235 filed Dec. 19, 2019 and entitled "INORGANIC DIES WITH ORGANIC INTERCONNECT LAYERS AND RELATED STRUCTURES," which is hereby incorporated by reference herein in its entirety.

BACKGROUND

Conventional integrated circuit (IC) packages typically include a silicon-based die electrically coupled to an organic material-based package substrate. The electrical coupling between the die and the package substrate may include solder bumps or wirebonds.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
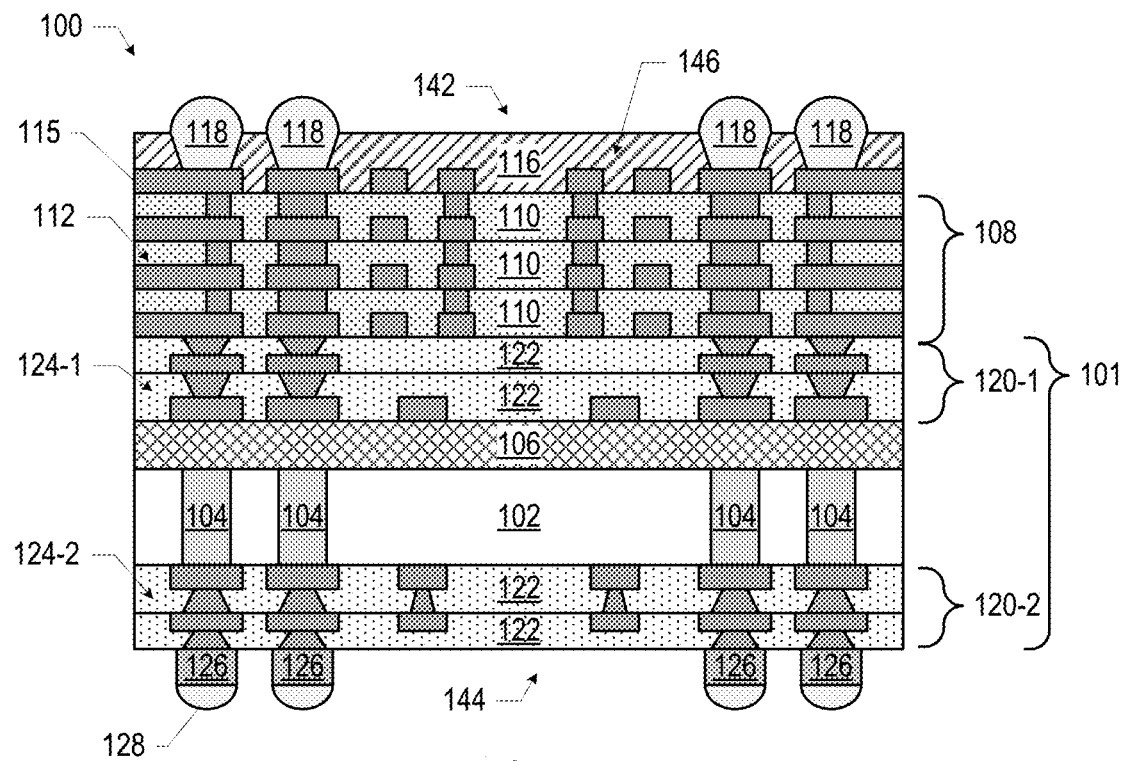
FIGS. 1-4 are side, cross-sectional views of example integrated circuit (IC) structures including an inorganic die with organic interconnect layers, in accordance with various embodiments.

Disclosed herein are inorganic dies with organic interconnect layers and related structures, devices, and methods. In some embodiments, an integrated circuit (IC) structure may include an inorganic die and one or more organic interconnect layers on the inorganic die, wherein the organic interconnect layers include an organic dielectric.

The embodiments disclosed herein may enable small form factor modules that may be particularly advantageous in radio frequency (RF) communication applications, such as millimeter wave and Wi-Fi. For example, next generation RF devices may need to support an increasing number of frequency bands that can be clearly separated from each other. Doing so may require high-quality factor (high-Q) filter circuits for each supported band. Manufacturing RF devices with such capabilities using conventional approaches typically results in a device with an extremely large form factor. The embodiments disclosed herein, however, may achieve high performance while maintaining or reducing device form factors. For example, in some embodiments, an inorganic substrate may support thick organic interconnect layers in which inductors may be integrated. Such integrated inductors may be part of the filter circuits, and may help provide higher quality filtering with a smaller form factor than conventionally achievable. The thick organic interconnect layers may reduce losses relative to thinner interconnects, and the use of low-loss organic dielectric materials may further reduce losses. Additionally, embodiments in which the inorganic substrate (e.g., silicon) is exposed may enable the use of such exposed material as a hermetic seal for resonator structures (functionality not achievable with conventional organic substrates), and electrical pathways through the inorganic substrate may provide electrical connectivity to the resonators.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

FIG. 1 is a side, cross-sectional view of an IC structure 100 including an inorganic die 101 with organic interconnect layers 108, in accordance with various embodiments.

Figure 2:
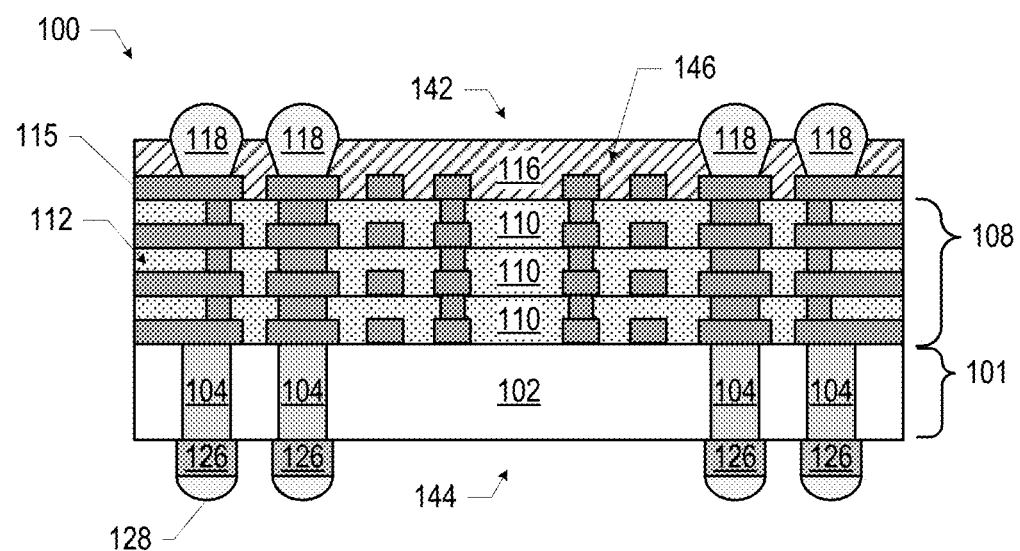
Figure 3:
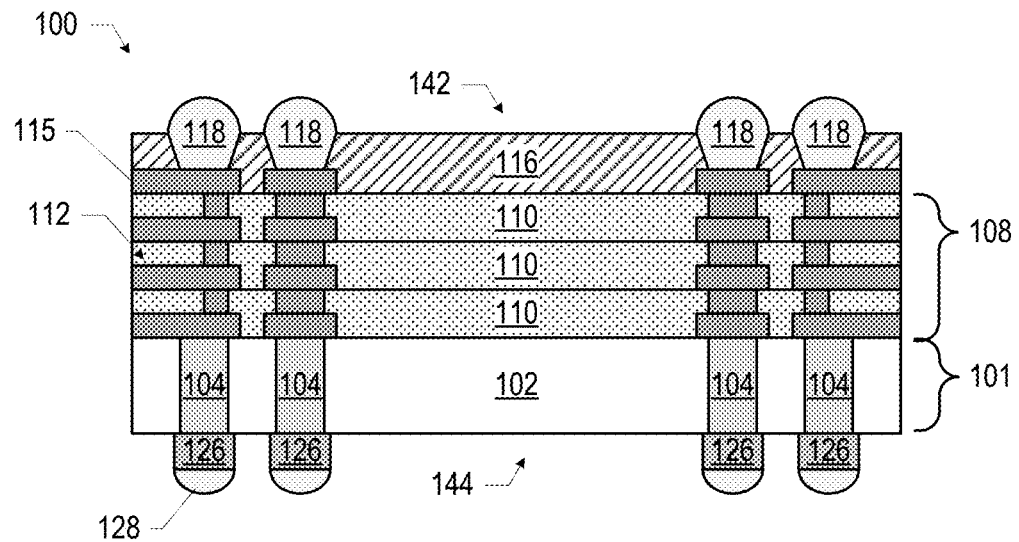
Figure 4:
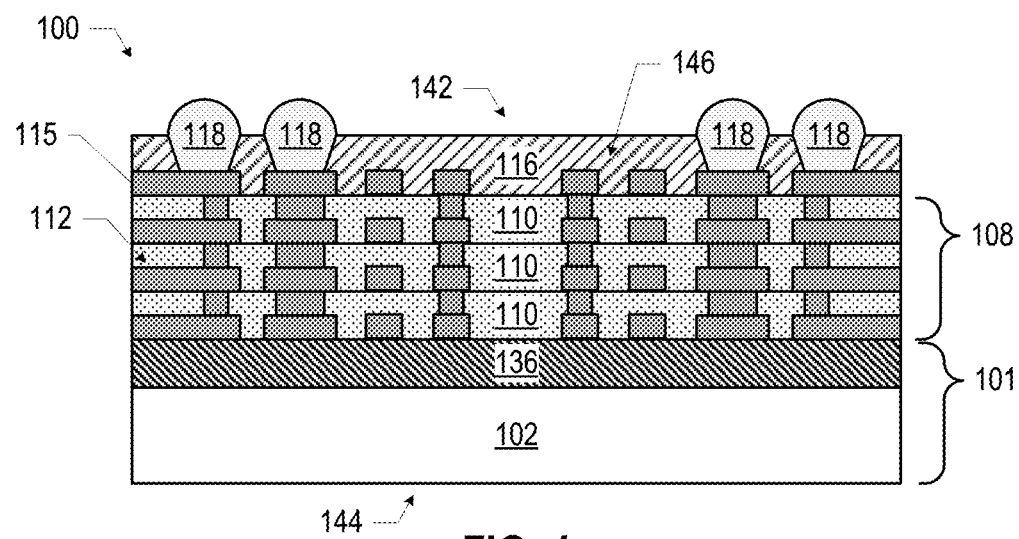

An inorganic die 101 may include an inorganic substrate 102, and may, in some embodiments, include one or more device layers 106 and/or one or more inorganic interconnect layers 120. For example, in the embodiment illustrated in FIG. 1, the inorganic die 101 includes a device layer 106 proximate to one face (e.g., the "frontside") of the inorganic substrate 102, inorganic interconnect layers 120-1 proximate to that same face of the inorganic substrate 102 (such that the device layer 106 is between the inorganic interconnect layers 120-1 and the inorganic substrate 102), and organic interconnect layers 108 on the inorganic interconnect layers 120-1 (such that the inorganic interconnect layers 120-1 are between the organic interconnect layers 108 and the device layer 106. Further, in the embodiment illustrated in FIG. 1, the inorganic die 101 includes inorganic interconnect layers 120-2 proximate to the opposite face (e.g., the "backside") of the inorganic substrate 102 as the inorganic interconnect layers 120-1. In other embodiments, the device layer(s) 106 and/or the inorganic interconnect layer(s) 120 may be omitted; for example, FIGS. 2-4 illustrate IC structures 100 in which no device layer 106 or inorganic interconnect layers 120 are present. Some embodiments (not illustrated) of the IC structure 100 may include one or more device layers 106 and one or more frontside inorganic interconnect layers 120 without including any backside inorganic interconnect layers 120. Some embodiments (not illustrated) of the IC structure 100 may include no device layers 106 but may include one or more frontside inorganic interconnect layers 120 and/or one or more backside inorganic interconnect layers 120. More generally, an inorganic die 101 including any desired combination of device layer(s) 106 and frontside and/or backside inorganic interconnect layers 120 may be used in an IC structure 100.

The inorganic substrate 102 may include any suitable inorganic material. In some embodiments, the inorganic substrate 102 may be a semiconductor substrate composed of semiconductor material systems including, for example, n-type or p-type materials systems (or a combination of both). The inorganic substrate 102 may include, for example, a crystalline substrate formed using a bulk silicon or a silicon-on-insulator (SOI) substructure. In some embodiments, the inorganic substrate 102 may be formed using alternative materials, which may or may not be combined with silicon, that include but are not limited to germanium, indium antimonide, lead telluride, indium arsenide, indium phosphide, gallium nitride, gallium arsenide, gallium nitride, or gallium antimonide. Further materials classified as group II-VI, III-V, or IV may also be included in the inorganic substrate 102. In some embodiments, the inorganic substrate 102 may include glass, diamond, sapphire, or a ceramic material. In RF applications, as discussed further below, the inorganic substrate 102 may advantageously include glass or silicon. As discussed further below, the inorganic substrate 102 may be part of a singulated die (e.g., the dies 1502 of FIG. 34) or a wafer (e.g., the wafer 1500 of FIG. 34).

Through-substrate vias (TSVs) 104 may extend through the inorganic substrate 102, providing electrical pathways across the inorganic substrate 102. The TSVs 104 may include an electrically conductive material (e.g., a metal) and may make contact with electrically conductive structures at opposite faces of the inorganic substrate 102. In some embodiments, no TSVs 104 may be present (e.g., as discussed below with reference to FIG. 4).

When present in an inorganic die 101, a device layer 106 may include one or more transistors (e.g., metal oxide semiconductor field-effect transistors (MOSFETs)), one or more diodes, or other suitable devices. For example, a device layer 106 may include transistors having source and/or drain (S/D) regions, a gate to control current flow in the transistors between the S/D regions, and one or more S/D contacts to route electrical signals to/from the S/D regions. The transistors may further include additional features, such as device isolation regions, gate contacts, and the like. The transistors in a device layer 106 may include any desired type of transistors, such as planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

The gate of a transistor in a device layer 106 may include at least two layers: a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions may be proximate to the gate of each transistor. The S/D regions may be formed using an implantation/diffusion process or an etching/deposition process, for example. In the former process, dopants such as boron, aluminum, antimony, phosphorous, or arsenic may be ion-implanted into a substrate to form the S/D regions. An annealing process that activates the dopants and causes them to diffuse farther into the substrate may follow the ion-implantation process. In the latter process, a substrate may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions may be formed using one or more alternate semiconductor materials such as germanium or a group III-V material or alloy. In further embodiments, one or more layers of metal and/or metal alloys may be used to form the S/D regions.

As noted above, in some embodiments, an IC structure 100 may include frontside inorganic interconnect layers 120-1 and/or backside inorganic interconnect layers 120-2. Electrical signals, such as power and/or input/output (I/O) signals, may be routed to and/or from the devices (e.g., the transistors and/or diodes) of the device layer 106, or otherwise to and/or from the inorganic die 101, through these inorganic interconnect layers 120. For example, electrically conductive features of the device layer 106 (e.g., gate and S/D contacts) may be electrically coupled to conductive pathways 124 through the inorganic interconnect layers 120. A set of inorganic interconnect layers 120 may also be referred to as a metallization stack.

Conductive lines and/or vias may be arranged within the inorganic interconnect layers 120 to route electrical signals along electrical pathways 124 according to a wide variety of designs. In particular, the arrangement is not limited to the particular configuration of conductive lines and vias depicted in FIG. 1 or any of the other accompanying drawings.

Lines and vias in the inorganic interconnect layers 120 may include an electrically conductive material such as a metal. The lines may be arranged to route electrical signals in a direction of a plane that is substantially parallel with a surface of the inorganic substrate 102. For example, the lines may route electrical signals in a direction in and out of the page from the perspective of FIG. 1. The vias may be arranged to route electrical signals in a direction of a plane that is substantially perpendicular to the surface of the inorganic substrate 102. In some embodiments, the vias may electrically couple lines of different inorganic interconnect layers 120 together.

The inorganic interconnect layers 120 may include an inorganic dielectric material 122 disposed between the lines and vias, as shown in FIG. 1. In some embodiments, the inorganic dielectric material 122 disposed between the lines and vias in different ones of the inorganic interconnect layers 120 may have different compositions; in other embodiments, the composition of the inorganic dielectric material 122 of different inorganic interconnect layers 120 may be the same.

Although the lines and the vias of the inorganic interconnect layers 120 are structurally delineated with a line within each inorganic interconnect layer 120 for the sake of clarity, the lines and the vias may be structurally and/or materially contiguous (e.g., simultaneously filled during a dual-damascene process) in some embodiments. In some embodiments, the thickness of the individual inorganic interconnect layers 120 may increase with the distance from the inorganic substrate 102 (e.g., the frontside inorganic interconnect layers 120-1 may increase in thickness closer to the front face 142, and the backside inorganic interconnect layers 120-2 may increase in thickness closer to the back face 144).

Organic interconnect layers 108 may be disposed at a face of the inorganic die 101. The organic interconnect layers 108 may include an organic dielectric material 110 and electrical pathways 112 through the organic dielectric material 110; the electrical pathways 112 may include conductive lines and/or vias embedded in the organic dielectric material 110, and vias may electrically couple lines in different ones of the organic interconnect layers 108, as discussed above with reference to the inorganic interconnect layers 120. Examples of organic dielectric materials 110 may include organic build-up films (e.g., including an organic matrix with an inorganic particle filler, such as silica-filled epoxies), polyimides with or without filler, benzocyclobutene polymers, or unfilled epoxies. Although a particular number of organic interconnect layers 108 (i.e., three) is depicted in FIG. 1 and others of the accompanying drawings, an IC structure 100 may include any desired number of organic interconnect layers 108. In some embodiments, for example, an IC structure 100 may include between two and eight organic interconnect layers 108.

In some embodiments, the organic dielectric material 110 included in an organic interconnect layer 108 may have a relatively low loss tangent (e.g., less than 0.01, less than 0.006, less than 0.004, or less than 0.001). Organic dielectric materials 110 with low loss tangents may be particularly useful when the IC structure 100 is part of an RF device, a number of examples of which are discussed herein; relatively thick layers of such organic dielectric materials 110 (e.g., having thicknesses between 10 microns and 60 microns) may be used without compromising RF performance, allowing thicker metallization (e.g., metal lines having a thickness between 5 microns and 35 microns), and thus lower resistance, in each organic interconnect layer 108 relative to embodiments in which lossier organic dielectric materials 110 are used. Unlike the inorganic interconnect layers 120, the thicknesses of the individual organic interconnect layers 108 may not necessarily increase with the distance from the inorganic substrate 102; in some embodiments, an organic interconnect layer 108 farther from the inorganic substrate 102 may be thinner than an organic interconnect layer 108 closer to the inorganic substrate 102. Different ones of the organic interconnect layers 108 may have different thicknesses. In some embodiments, the organic dielectric material 110 may not be photodefinable; instead, the organic interconnect layers 108 may be built up by depositing a layer of conductive material (e.g., metal), performing a lithographic operation to pattern the metal into vias, depositing the organic dielectric material 110, and then performing a via reveal operation.

In some embodiments, the organic dielectric material 110 included in an organic interconnect layer 108 may have a relatively low coefficient of thermal expansion (CTE) (e.g., below 20 parts per million per degree Celsius). The CTEs of such low-CTE organic dielectric materials 110 are generally closer to the CTE of the materials that may be included in the inorganic die 101 (e.g., as the inorganic substrate 102), and thus IC structures 100 including low-CTE organic dielectric materials 110 may exhibit reduced mechanical stress (and thus greater reliability during operation) at the interface between the organic interconnect layers 108 and the inorganic die 101 relative to embodiments in which organic dielectric materials 110 with higher CTEs are used.

The IC structure 100 of FIG. 1 also includes one or more passive components 146 integrally formed in the organic interconnect layers 108. In some embodiments, the passive components 146 may include one or more inductors, as shown in FIG. 1, which may be particularly advantageous in RF settings. Inductors and other passive components 146 (e.g., capacitors and/or resistors) may be formed in the organic interconnect layers 108 using a lithographic via process, as known in the art, and may be electrically connected to electrical pathways 112 in the organic interconnect layers 108 so that the passive components 146 may be part of circuitry implemented by the IC structure 100. Any of the IC structures 100 disclosed herein may include any desired number and arrangement of passive components 146 in the organic interconnect layers 108. Although FIG. 1 illustrates a particular arrangement of inductors in particular ones of the organic interconnect layers 108, any inductor or other passive component 146 formed integrally with the organic interconnect layers 108 may be positioned as desired in any one or more of the organic interconnect layers 108. In some embodiments of the IC structures 100 disclosed herein, no passive components 146 may be integrated into the organic interconnect layers 108.

The IC structure 100 may include a solder resist material 116 (e.g., polyimide or similar material) and one or more conductive contacts 115 on the organic interconnect layers 108. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). In FIG. 1, the conductive contacts 115 are illustrated as taking the form of bond pads. The conductive contacts 115 may be electrically coupled with the electrical pathways 112 of the organic interconnect layers 108 and may route the electrical signals of the device layer 106 and/or other electrical signals (e.g., electrical signals received at the conductive contacts 126) to other external devices. For example, solder 118 may be deposited on the one or more conductive contacts 115 to mechanically and/or electrically couple the IC structure 100 with another component at the front face 142 (e.g., another chip). The IC structure 100 may include additional or alternate structures to route the electrical signals to/from the organic interconnect layers 108; for example, the conductive contacts 115 may include other analogous features (e.g., posts) that route the electrical signals to/from external components. In some embodiments, the solder resist material 116 may be photodefinable (and thus may be directly patterned).

In some embodiments, the IC structure 100 may include one or more conductive contacts 126 on the back face 144 of the IC structure 100. In some embodiments, a solder resist material (not shown) may also be present. In FIG. 1, the conductive contacts 126 are illustrated as taking the form of pillars (e.g., copper pillars). The conductive contacts 126 may be electrically coupled with the electrical pathways 124-2 of the backside inorganic interconnect layers 120-2 (when the backside inorganic interconnect layers 120-2 are present) or the TSVs 104 (when the backside inorganic interconnect layers 120-2 are not present) and may route the electrical signals of the device layer 106 and/or other electrical signals (e.g., electrical signals received at the conductive contacts 115) to other external devices. For example, solder bumps 128 may be formed on the one or more conductive contacts 126 to mechanically and/or electrically couple the IC structure 100 with another component at the back face 144 (e.g., another chip). The IC structure 100 may include additional or alternate structures to route the electrical signals to/from the back face 144; for example, the conductive contacts 126 may include other analogous features (e.g., bond pads) that route the electrical signals to/from external components.

As noted above, FIGS. 2-4 illustrate embodiments of the IC structure 100 that do not include a device layer 106 or inorganic interconnect layers 120. In FIG. 2, the IC structure 100 includes backside conductive contacts 126 that are in electrical contact with the TSVs 104, which are in turn in electrical contact with the electrical pathways 112 of the organic interconnect layers 108. The inorganic substrate 102 exposed at the back face 144 of the IC structure 100 of FIG. 2 presents the opportunity to use the exposed inorganic substrate 102 as part of a hermetic seal, and thus the IC structure 100 of FIG. 2 may be particularly advantageous as a hermetic lid on a resonator component (e.g., as discussed below with reference to the lidded resonator assemblies 164 of FIGS. 17-21).

The IC structure 100 of FIG. 3 is similar to that of FIG. 2, but does not include any passive components 146. In an RF setting, passive components (such as inductors, capacitors, and/or resistors) may be surface-mounted to the conductive contacts 115 at the front face 142 of the IC structure 100 via the solder 118, or may be otherwise electrically coupled to the IC structure 100 as desired. Like the IC structure 100 of FIG. 2, the inorganic substrate 102 exposed at the back face 144 of the IC structure 100 of FIG. 3 presents the opportunity to use the exposed inorganic substrate 102 as part of a hermetic seal, and thus the IC structure 100 of FIG. 3 may be particularly advantageous as a hermetic lid on a resonator component (e.g., as discussed below with reference to the lidded resonator assemblies 164 of FIGS. 17-21).

The structure 100 of FIG. 4 is also similar to that of FIG. 2, but does not include any TSVs 104 and does include a barrier material 136 between the inorganic substrate 102 and the organic interconnect layers 108. The barrier material 136 may be selected to limit diffusion between the inorganic substrate 102 and the organic dielectric material 110; for example, when the inorganic substrate 102 includes silicon, the barrier material 136 may include silicon nitride. An IC structure 100 like that of FIG. 4 may be particularly advantageous as an interposer (e.g., an embedded interposer in an organic package substrate) between different RF dies or other electronic components coupled to the front face 142; when low-loss organic dielectric materials 110 are utilized in the organic interconnect layers 108, the IC structure 100 may provide low-loss electrical pathways between such dies.

The IC structures 100 disclosed herein may be manufactured using any suitable technique. For example, FIGS. 5-11 illustrate stages in an example process for manufacturing the IC structure 100 of FIG. 1, in accordance with various embodiments. Although the operations of the process of FIGS. 5-11 are illustrated with reference to particular embodiments of the IC structures 100 disclosed herein, the process may be used to form any suitable IC structures 100. Operations are illustrated once each and in a particular order in FIGS. 5-11, but the operations may be reordered and/or repeated as desired (e.g., with different operations performed in parallel when manufacturing multiple electronic components simultaneously).

Figure 5:
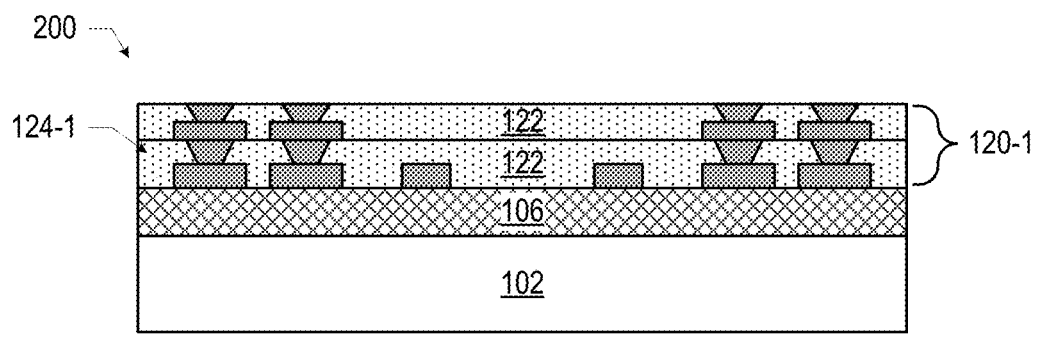
FIGS. 5-11 illustrate stages in an example process of manufacturing the IC structure of FIG. 1, in accordance with various embodiments.

FIG. 5 is a side, cross-sectional view of an assembly 200 including an inorganic substrate 102, a device layer 106, and frontside inorganic interconnect layers 120-1 including electrical pathways 124-1. The assembly 200 may be manufactured using conventional microelectronics fabrication techniques for forming a device layer and a metallization stack thereon. As noted above, in some embodiments, the thicknesses of the frontside inorganic interconnect layers 120-1 may increase farther from the inorganic substrate 102.

Figure 6:
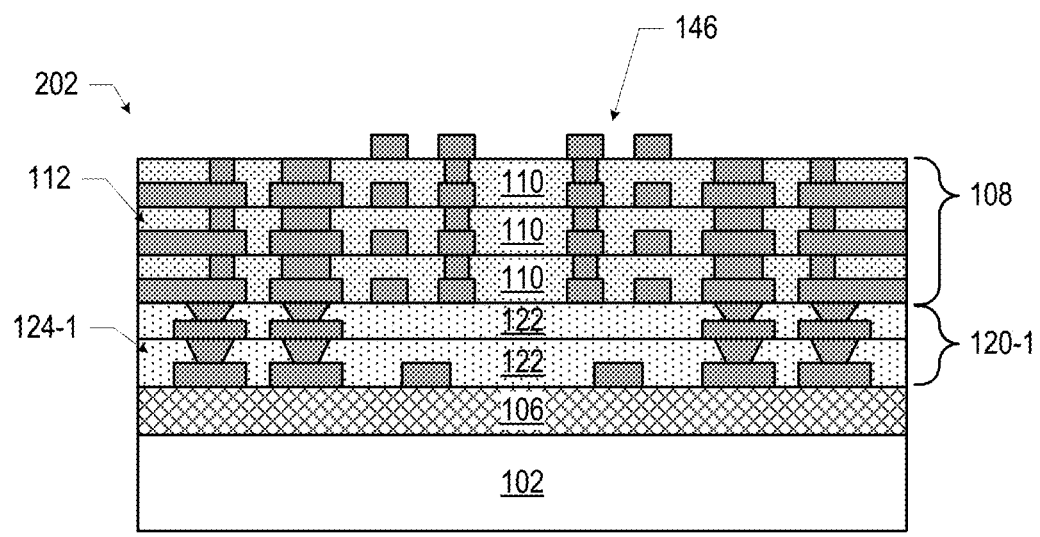

FIG. 6 is a side, cross-sectional view of an assembly 202 subsequent to forming organic interconnect layers 108 on the frontside inorganic interconnect layers 120-1 of the assembly 200 (FIG. 5). The organic interconnect layers 108 may include electrical pathways 112, conductive contacts 115, and passive components 146, as desired. In some embodiments, a lithographic via process may be used to form vias in the organic interconnect layers 108 (and also pattern any suitable structures of the passive components 146). As noted above, in some embodiments, the thicknesses of the organic interconnect layers 108 may not necessarily increase farther from the inorganic substrate 102. In embodiments in which the frontside inorganic interconnect layers 120-1 and/or the device layer 106 are not to be included in the IC structure 100, the operations of FIG. 6 may be performed directly on the inorganic substrate 102 (e.g., as illustrated in FIGS. 2 and 3) or on a barrier material 136 on an inorganic substrate 102 (e.g., as illustrated in FIG. 4).

Figure 7:
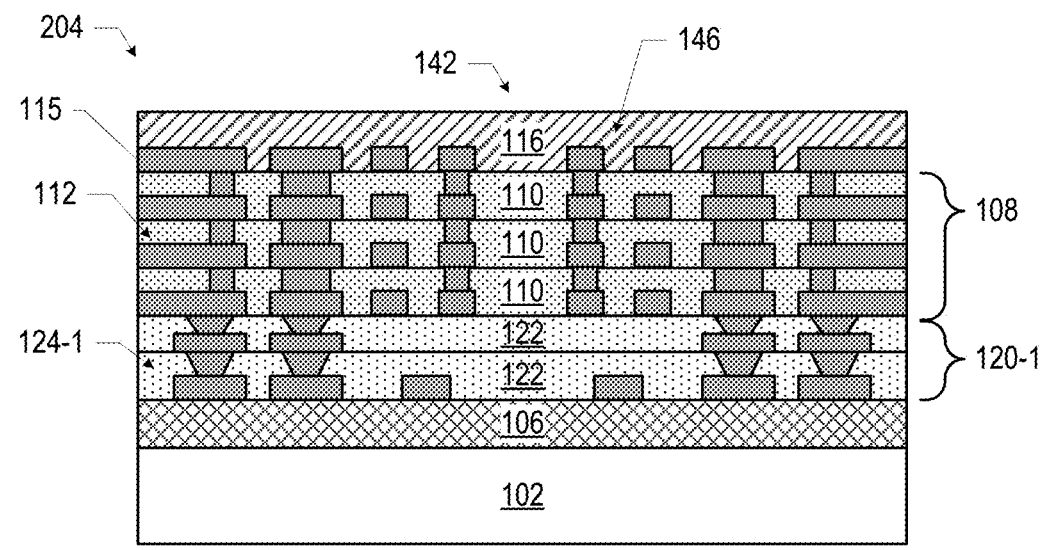

FIG. 7 is a side, cross-sectional view of an assembly 204 subsequent to depositing a solder resist material 116 on the organic interconnect layers 108 of the assembly 202 (FIG. 6). In some embodiments, the solder resist material 116 may be laminated, sprayed, or otherwise deposited.

Figure 8:
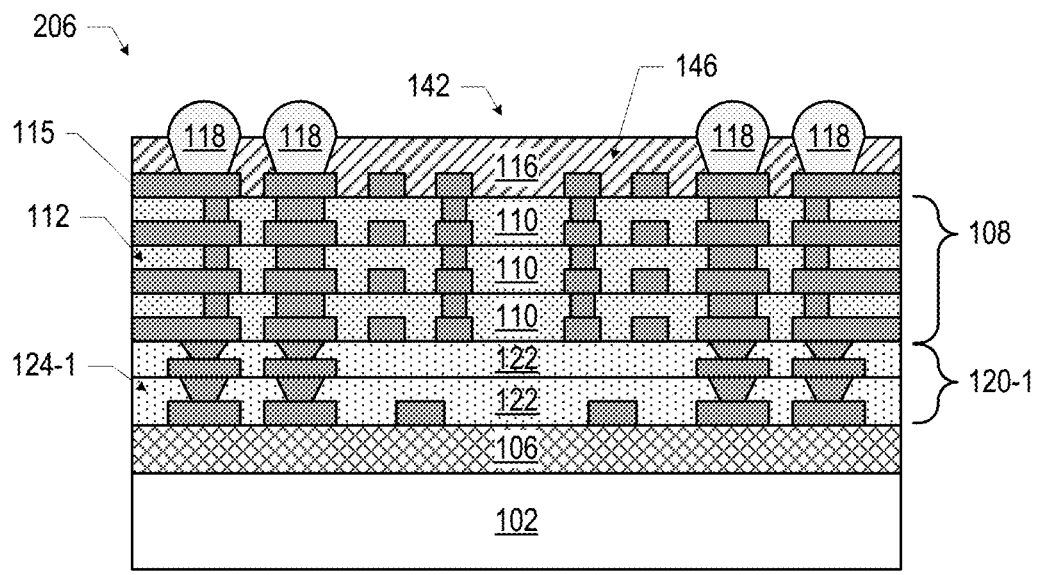

FIG. 8 is a side, cross-sectional view of an assembly 206 subsequent to forming openings in the solder resist material 116 of the assembly 204 (FIG. 7) to expose the surfaces of the conductive contacts 115, and depositing solder 118 in the openings in electrical contact with the conductive contacts 115.

Figure 9:
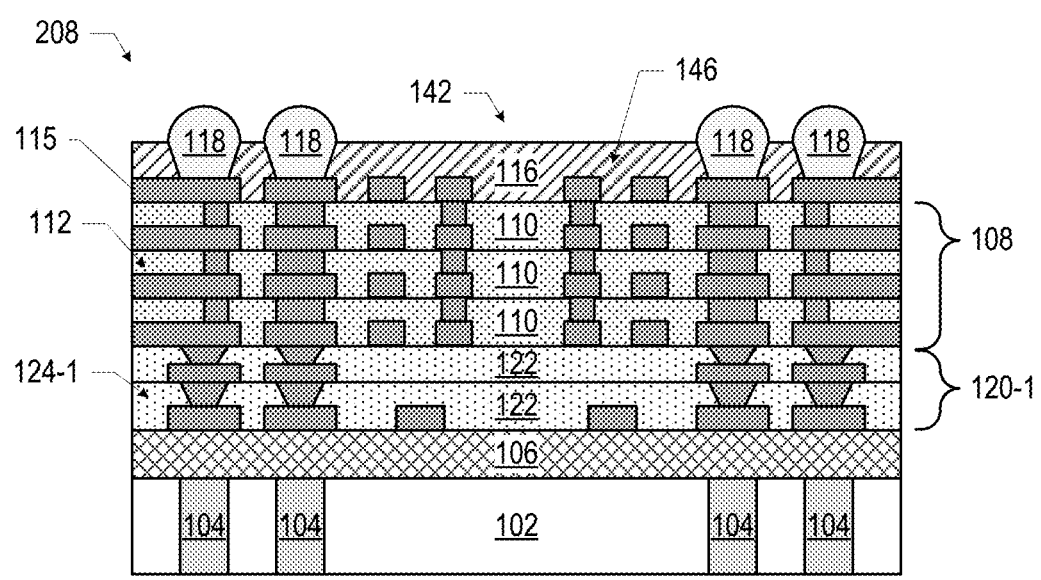

FIG. 9 is a side, cross-sectional view of an assembly 208 subsequent to forming TSVs 104 through the inorganic substrate 102 of the assembly 206 (FIG. 8). In some embodiments, the operations illustrated in FIGS. 9-11 may be performed after "flipping" the assembly 206 (FIG. 8) so that the inorganic substrate 102 is facing "up"; such "flipping" operations are illustrated in FIGS. 5-11, but may be performed as desired. In some embodiments, the TSVs 104 may be formed by laser drilling holes through the inorganic substrate 102 to expose regions in the device layer 106, and then filling these holes with one or more conductive materials so that the TSVs 104 are in electrical contact with the exposed regions of the device layer 106. In some embodiments, the TSVs 104 may have a tapered shape, narrowing towards the front face 142 of the IC structure 100 as a consequence of the laser drilling. In embodiments in which the IC structure 100 does not include the TSVs 104 (e.g., the IC structure 100 of FIG. 4), the operations discussed with reference to FIGS. 9-11 may not be performed.

Figure 10:
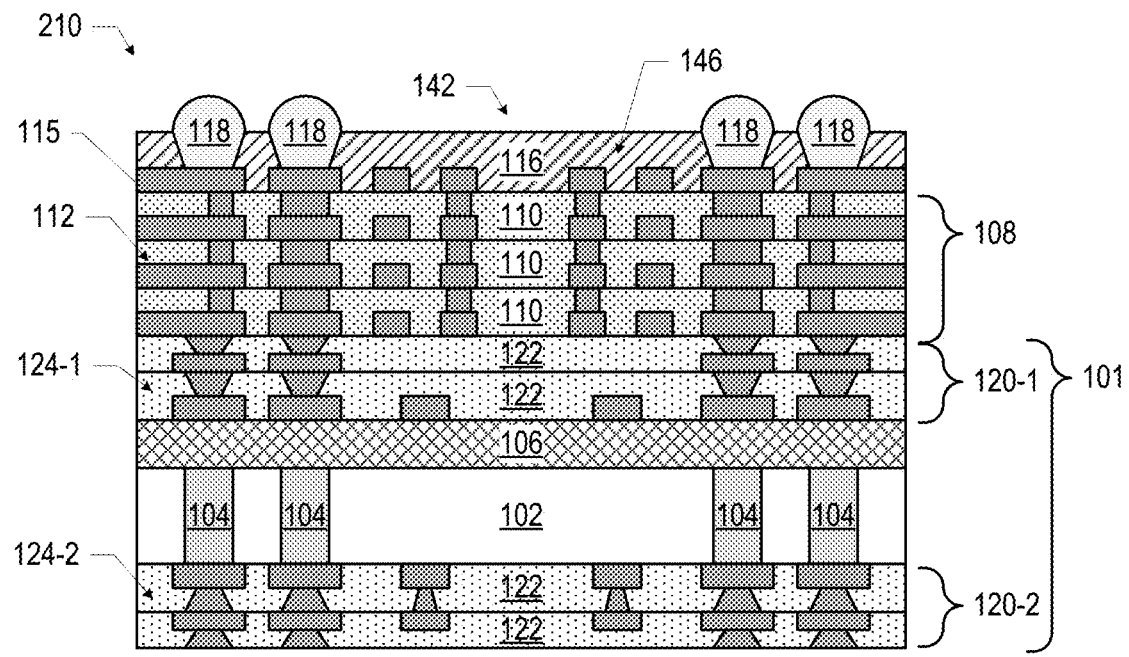

FIG. 10 is a side, cross-sectional view of an assembly 210 subsequent to forming the backside inorganic interconnect layers 120-2 on the inorganic substrate 102 of the assembly 208 (FIG. 9). The backside inorganic interconnect layers 120-2 may be formed using any of the techniques used to form the frontside inorganic interconnect layers 120-1. The backside inorganic interconnect layers 120-2 may include conductive pathways 124-2, some of which may be in electrical contact with the TSVs 104. In embodiments in which the IC structure 100 does not include backside inorganic interconnect layers 120-2 (e.g., the IC structures 100 of FIGS. 2 and 3), the operations discussed with reference to FIG. 10 may not be performed.

Figure 11:
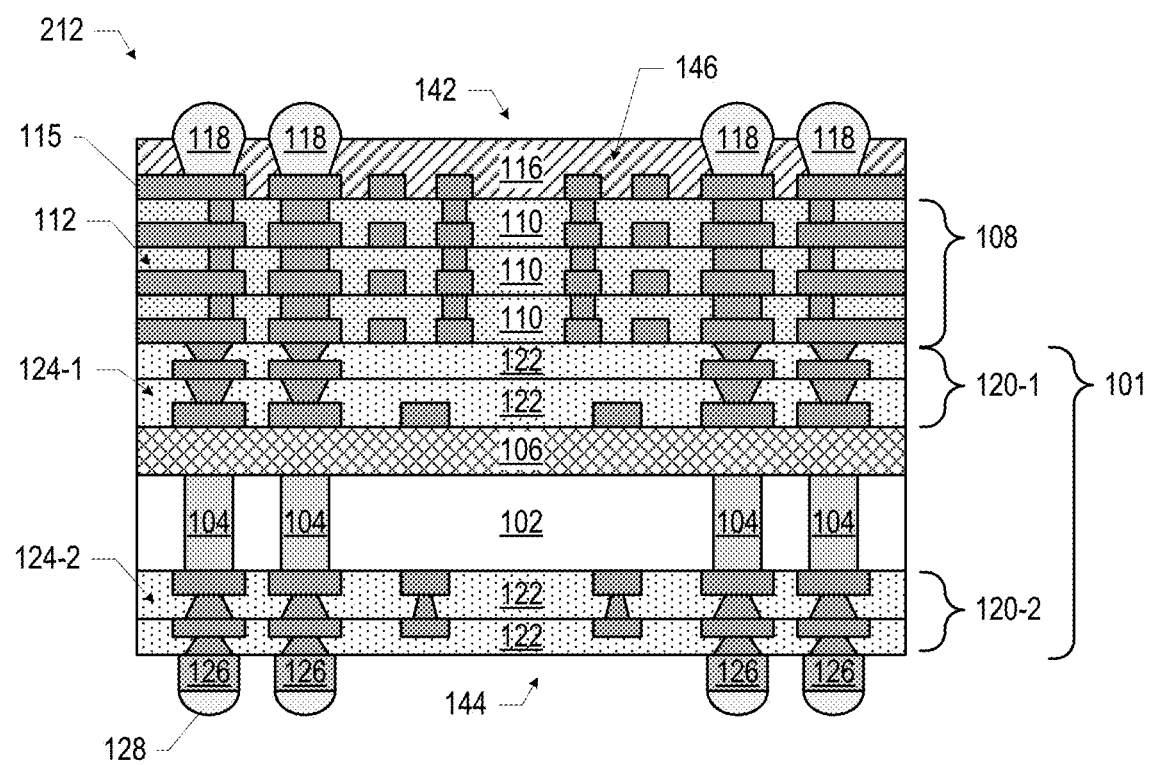

FIG. 11 is a side, cross-sectional view of an assembly 212 subsequent to forming the conductive contacts 126 on the backside inorganic interconnect layers 120-2 of the assembly 210 (FIG. 10), then providing solder 128 on the conductive contacts 126. The assembly 212 may take the form of the IC structure 100 of FIG. 1. In some embodiments, the operations of FIGS. 5-11 may begin with an assembly that includes repeating units of the assembly 200 of FIG. 5, and the assemblies of FIGS. 6-11 may likewise include repeating units of those depicted; upon completion, these repeating units may be singulated from each other, yielding individual IC structures 100. In some embodiments, this singulation may take place after additional components are coupled to the IC structures 100, as discussed below with reference to FIGS. 13-15.

Figure 12:
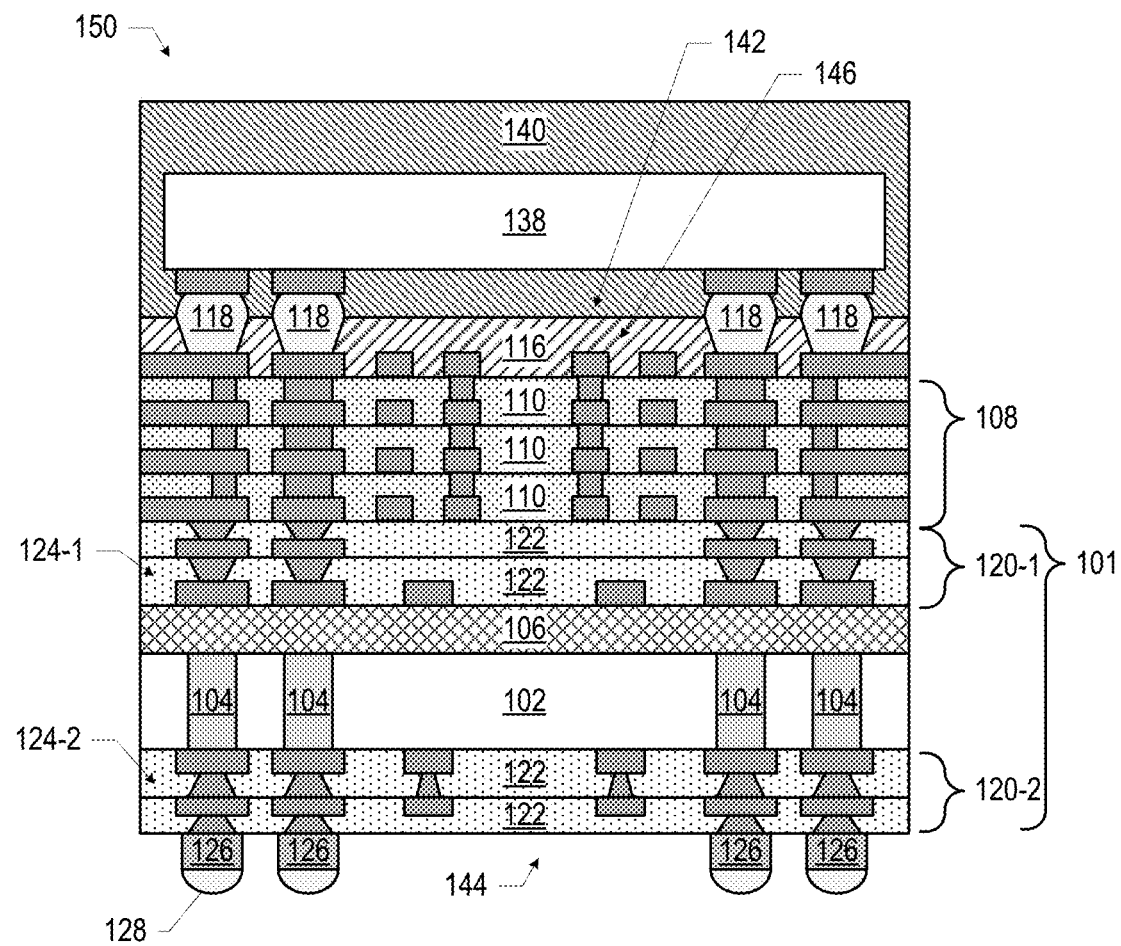
FIG. 12 is a side, cross-sectional view of an IC assembly including an IC structure, in accordance with various embodiments.

As noted above, various components may be coupled to the front face 142 of an IC structure 100 and/or the back face 144 of an IC structure 100. For example, FIG. 12 illustrates an IC assembly 150 including a component 138 electrically and mechanically coupled to the IC structure 100 via the solder 118 on the conductive contacts 115 at the front face 142. In some embodiments, the component 138 may take the form of any of the embodiments of the RF circuitry dies 166 disclosed herein, or may include any other suitable die or other IC. Although the IC assembly 150 illustrated in FIG. 12 includes the particular IC structure 100 of FIG. 1 coupled to a single component 138, IC assemblies 150 may include any of the IC structures 100 disclosed herein (e.g., IC structures 100 that do or do not include a device layer 106, IC structures 100 that do or do not include backside inorganic interconnect layers 120-2, IC structures 100 that do or do not include the TSVs 104, etc.) with any number and arrangement of components 138 coupled thereto.

Figure 13:
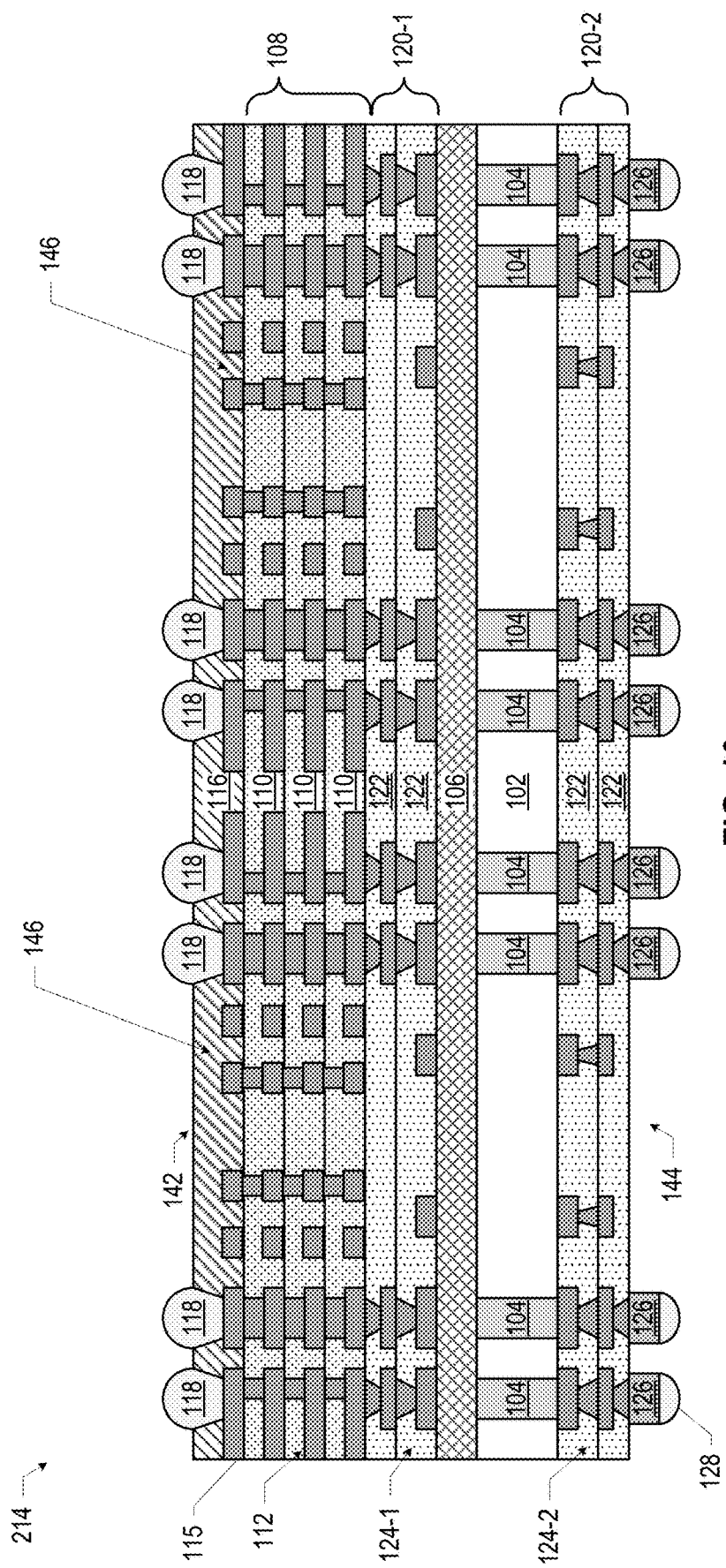
FIGS. 13-15 illustrate stages in an example process of manufacturing the IC assembly of FIG. 12, in accordance with various embodiments.
Figure 14:
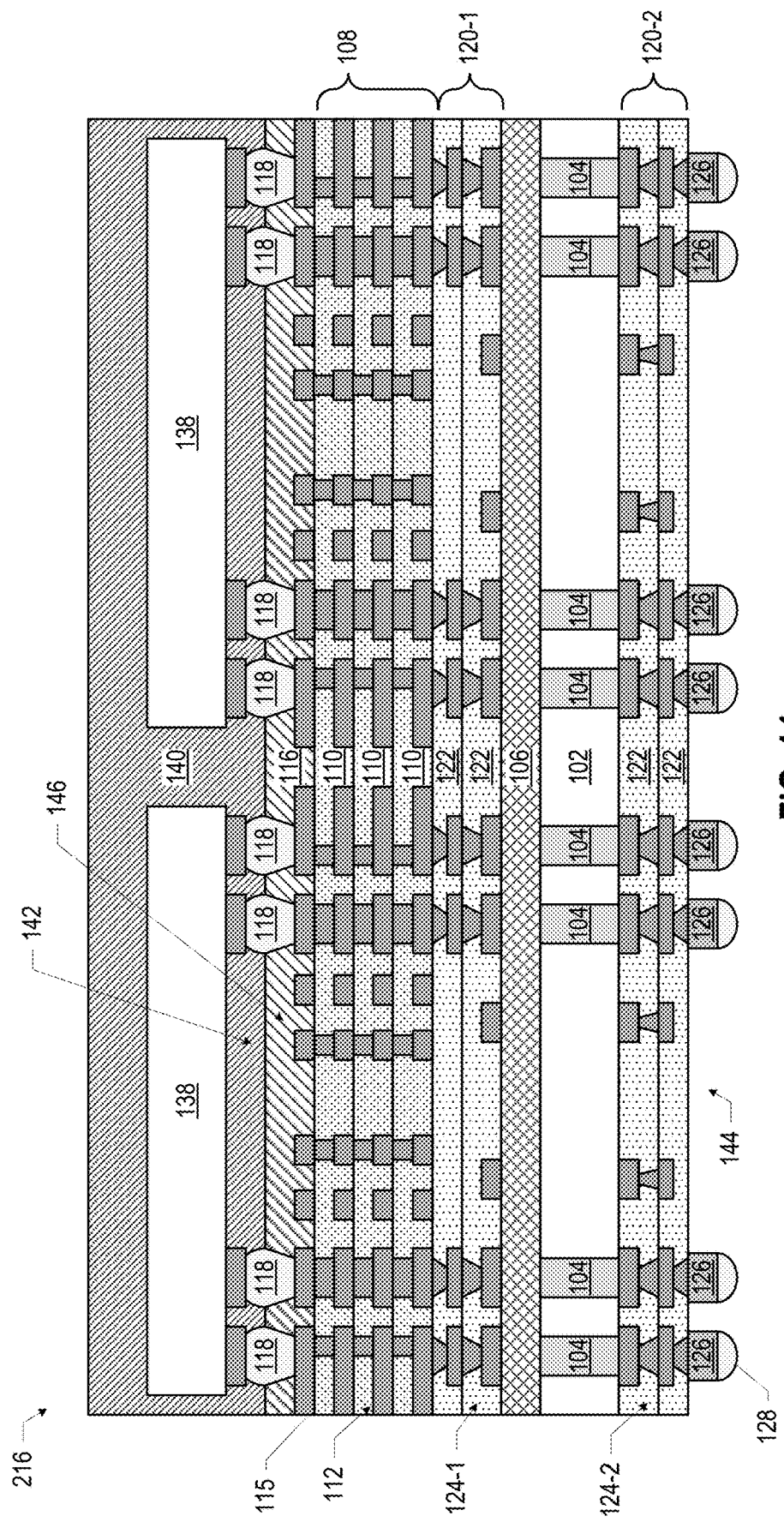
Figure 15:
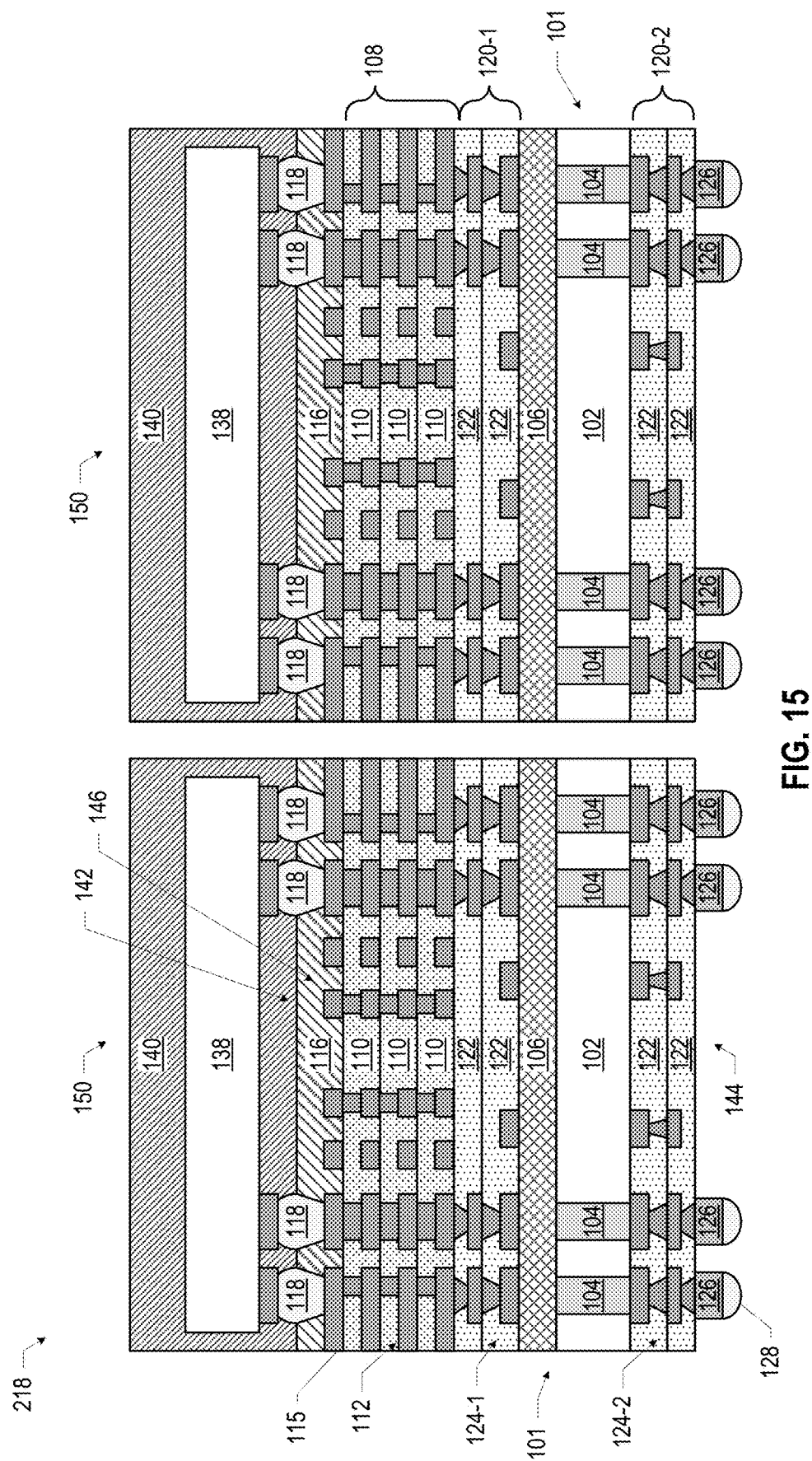

An IC assembly 150 may be manufactured using any suitable techniques. FIGS. 13-15 illustrate stages in an example process of manufacturing the IC assembly 150 of FIG. 12, in accordance with various embodiments. Although the operations of the process of FIGS. 13-15 are illustrated with reference to particular embodiments of the IC assemblies 150 disclosed herein, the process may be used to form any suitable IC assembly 150. Operations are illustrated once each and in a particular order in FIGS. 13-15, but the operations may be reordered and/or repeated as desired (e.g., with different operations performed in parallel when manufacturing multiple electronic components simultaneously).

FIG. 13 is a side, cross-sectional view of an assembly 214 that has the form of repeated units of the assembly 212 (FIG. 11); such an assembly may be manufactured as discussed above with reference to FIGS. 5-11.

FIG. 14 is a side, cross-sectional view of an assembly 216 subsequent to coupling components 138 to the conductive contacts 115 at the front face 142 of the assembly 214 (FIG. 13), and then depositing a mold compound 140 around the components 138. In some embodiments, an underfill material different from the mold compound 140 may be deposited between the components 138 and the front face 142. Example materials that may be used for the mold compound 140 and the underfill material (not shown) include epoxy matrices with filler particles of inorganic material such as silica, alumina, etc.

FIG. 15 is a side, cross-sectional view of an assembly 218 subsequent to singulating the assembly 216 (FIG. 14) to separate the assembly 216 into multiple IC assemblies 150. Any suitable technique may be used to singulate the assembly 216, such as sawing. In some embodiments, prior to singulation, the mold compound 140 may be polished away to expose the "top" surface of the components 138.

Figure 16:
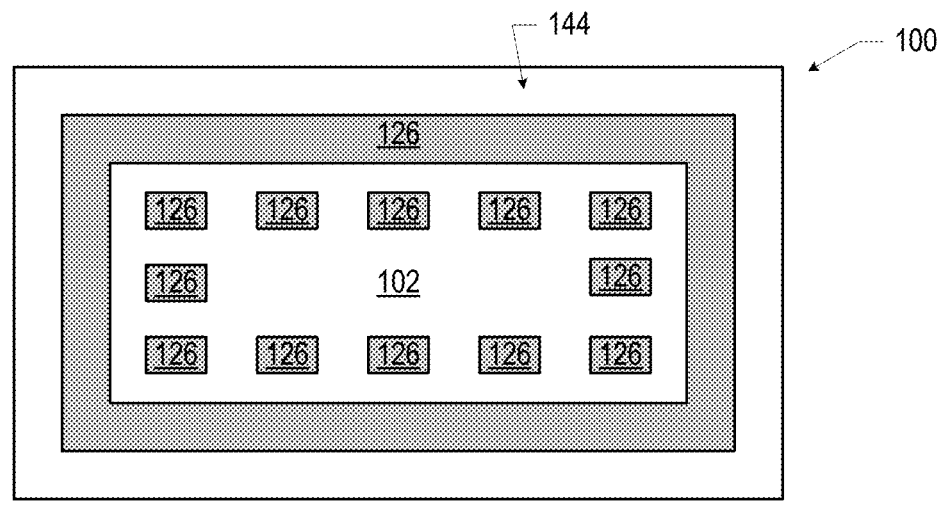
FIG. 16 depicts a back face of an IC structure including a ring-shaped contact, in accordance with various embodiments.

As noted above, embodiments in which the inorganic substrate 102 is exposed at the back face 144 of the IC structure 100 may be particularly advantageous when a hermetic coupling to another component is desired. For example, FIG. 16 is a "bottom" view of a back face 144 of an IC structure 100 in which one of the conductive contacts 126, on the inorganic substrate 102, has a ring shape, in accordance with various embodiments. The ring-shaped conductive contact 126 may or may not be coupled to any electrical pathways in the IC structure 100; instead, the ring-shaped conductive contact 126 (e.g., a copper ring) may be used to form a hermetic seal with another component, as discussed below with reference to FIG. 17. In some embodiments, the IC structure 100 may include a ring on the inorganic substrate 102 at the back face 144, but this ring may not be conductive, and may instead be formed of a non-conductive material with which a hermetic seal may be made. The IC structure 100 of FIG. 16 may or may not have a device layer 106, frontside inorganic interconnect layers 120, and/or a barrier material 136, as desired.

Figure 17:
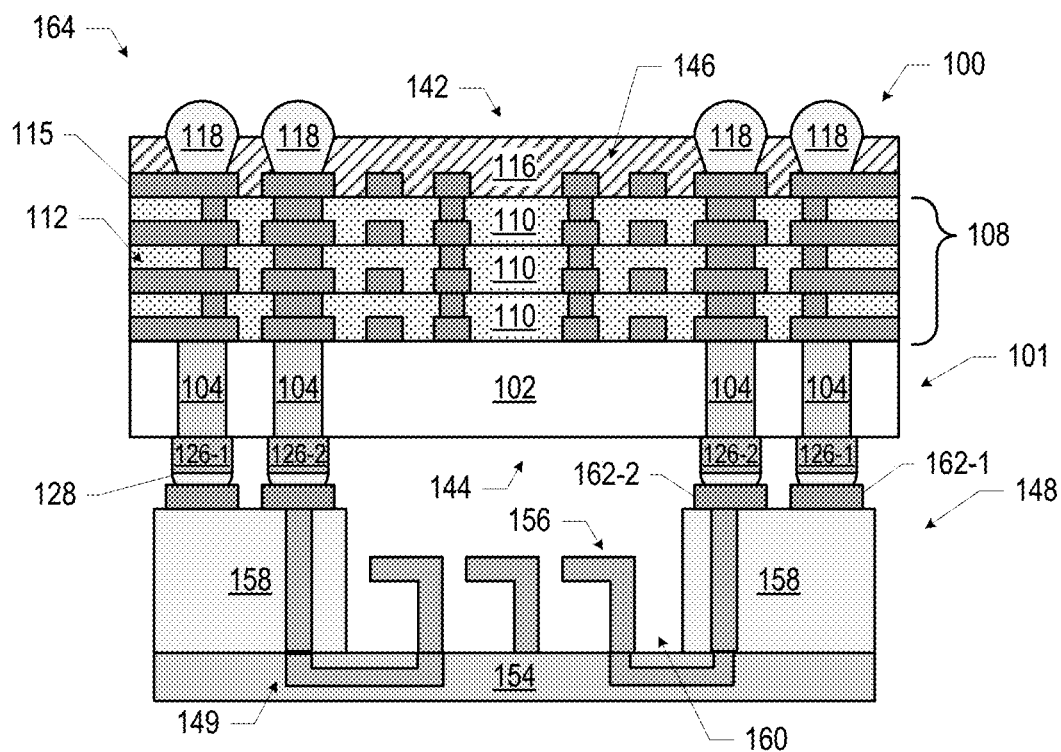
FIG. 17 is a side, cross-sectional view of a lidded resonator assembly including an IC structure like that of FIG. 16, in accordance with various embodiments.

FIG. 17 is a side, cross-sectional view of a lidded resonator assembly 164 including an IC structure 100 like that of FIG. 16, in accordance with various embodiments. The lidded resonator assembly 164 includes a resonator component 148 coupled to an IC structure 100 having a ring-shaped conductive contact 126-1 on the inorganic substrate 102 at the back face 144, as discussed above with reference to FIG. 16. Although FIG. 17 illustrates a particular IC structure 100 without a device layer 106 or frontside inorganic interconnect layers 120, other embodiments of the lidded resonator assembly 164 may include one or more of such features, or additional features as desired.

The resonator component 148 may include a base 154, one or more resonators 156 (e.g., one or more acoustic wave resonators (AWRs), such as surface AWRs) or any other suitable type of resonator) coupled to the base 154, and side walls 158. A ring-shaped conductive contact 162-1 (e.g., a copper ring) on the side walls 158 may be coupled to the ring-shaped conductive contact 126-1 of the IC structure 100 by a similarly ring-shaped portion of solder 128 so that the IC structure 100 provides a "lid" on the resonator component 148. In particular, the coupling between the ring-shaped conductive contact 162-1 and the ring-shaped conductive contact 126-1 may define a hermetically sealed cavity 160 into which one or more resonators 156 extend. The cavity 160 may be under vacuum, or may include a gas (e.g., air, nitrogen, etc.) to reduce or control damping of the resonators 156. In some embodiments, the resonators 156 may include a piezoelectric material, and thus mechanical deformation of the resonators 156 may be associated with the generation of electrical signals. In particular, the frequency of resonance of the resonators 156 may be desirably located at the center of the passband for each supported frequency band. Further conductive contacts 162-2 of the resonator component 148 may be coupled to other ones of the conductive contacts 126-2 of the IC structure 100, and may be part of electrical pathways 149 between the IC structure 100 and the resonators 156 through the resonator component 148.

The dimensions of the resonator component 148 may take any suitable values. In some embodiments, the height of the resonator component 148 may be between 50 microns and 500 microns. In some embodiments, a lidded resonator assembly 164 may include one or more resonator components 148 coupled to the IC structure 100. A lidded resonator assembly 164 with multiple resonator components 148 may be particularly useful when resonators 156 of different thicknesses are to be used; in some such embodiments, resonator components 148 having resonators 156 of different thicknesses may be manufactured separately (e.g., on separate wafers) and then multiple ones of the resonator components 148 may be coupled to a common IC structure 100. In some embodiments, a lidded resonator assembly 164 may include multiple IC structures 100 each coupled to one or more resonator components 148; in some such embodiments, a mold compound or other material may allow the multiple IC structures 100 (with attached resonator components 148) to be treated as a single, integral lidded resonator assembly 164.

Lidded resonator assemblies 164, including an IC structure 100 as discussed above, may be particularly useful in RF applications. For example, FIGS. 18-21 are side, cross-sectional views of example RF front-end (FE) modules 180 including lidded resonator assemblies 164 (e.g., the lidded resonator assembly 164 of FIG. 17), in accordance with various embodiments. The RF FE modules 180 of FIGS. 18-21 all include an RF circuitry die 166 electrically coupled to a lidded resonator assembly 164. Although the RF FE modules 180 of FIGS. 18-21 depict a single RF circuitry die 166 and a single lidded resonator assembly 164, this is simply for ease of illustration, and any of the RF FE modules 180 disclosed herein may include multiple RF circuitry dies 166 (e.g., coupled to the lidded resonator assembly 164 in a 2D, 2.5D, or 3D fashion) and/or multiple lidded resonator assemblies 164. The RF circuitry dies 166 included in an RF FE module 180 may include circuitry to support RF FE operation, such as one or more power amplifiers (PAs), one or more switches, driver circuitry, and/or one or more matching networks. The RF circuitry dies 166 may be packaged in any desired manner, or unpackaged, as desired. Additional components, such as surface-mounted passive components, may also be included in an RF FE module 180. The RF FE modules 180 of FIGS. 18-21 all include conductive contacts 174 which may be used to couple the RF FE module 180 to another component (e.g., a circuit board, such as a motherboard, an interposer, or another IC package, etc.). In some embodiments, the interconnects in contact with the conductive contacts 174 may be second-level interconnects. The conductive contacts 174 illustrated in FIGS. 18-21 are shown as coupled to solder bumps 176 (e.g., for a ball grid array arrangement), but any suitable second-level interconnects may be used (e.g., pins in a pin grid array arrangement or lands in a land grid array arrangement).

Figure 18:
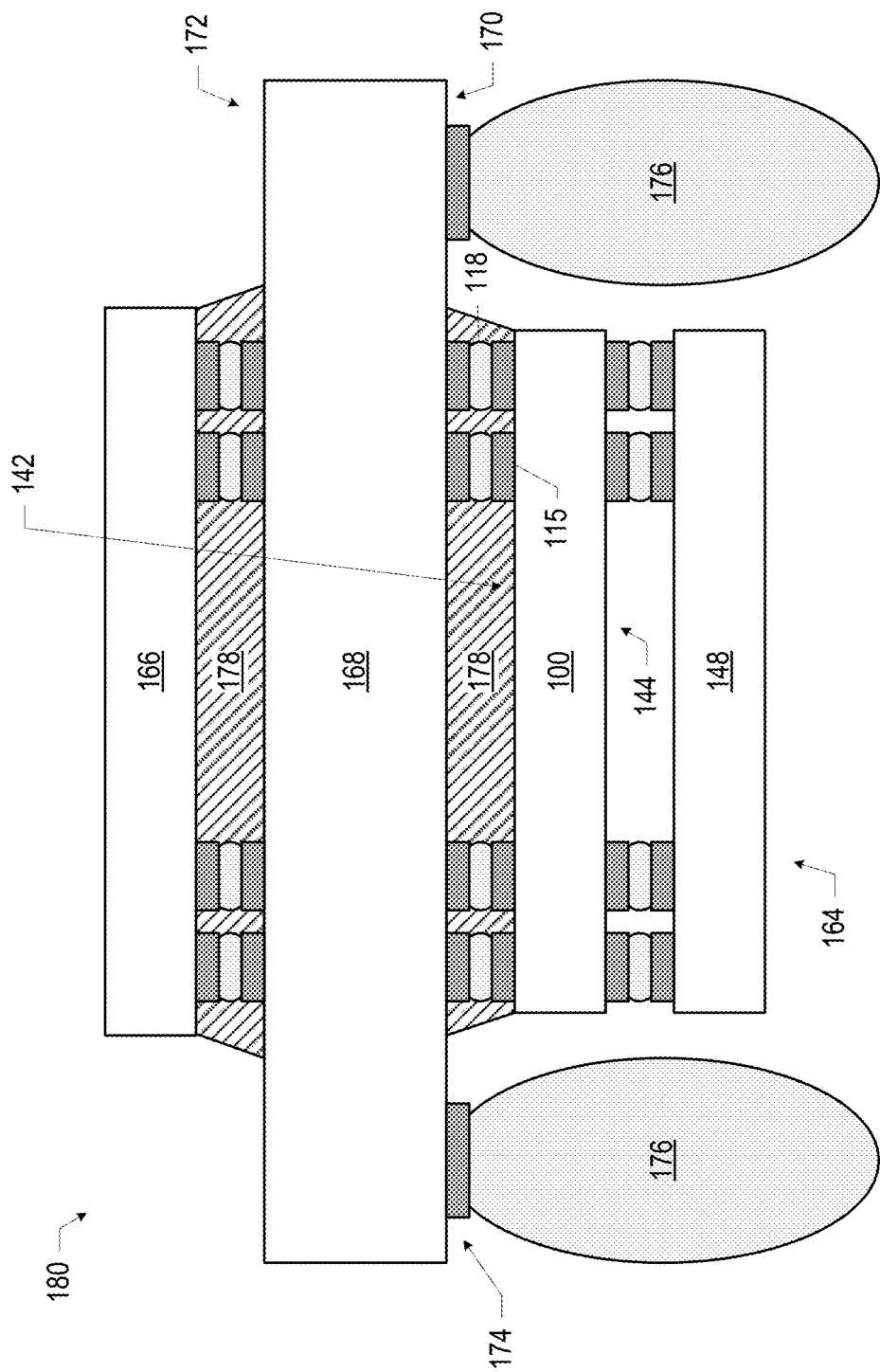
FIGS. 18-21 are side, cross-sectional views of radio frequency (RF) front-end (FE) modules including a lidded resonator assembly, in accordance with various embodiments.

The RF FE module 180 of FIG. 18 includes an organic package substrate 168 having a first face 170 and the second face 172. One or more RF circuitry dies 166 may be electrically and mechanically coupled to the second face 172 (e.g., via solder, as shown), and a lidded resonator assembly 164 (including a resonator component 148 hermetically coupled to the back face 144 of an IC structure 100, as shown) may be electrically and mechanically coupled to the first face 170. In some embodiments, conductive contacts 115 at the front face 142 of the IC structure 100 of the lidded resonator assembly 164 may be coupled to conductive contacts at the first face 170 of the organic package substrate 168 via solder 118, as shown. An underfill material 178 may be disposed between the organic package substrate 168 and the RF circuitry die 166, and/or between the IC structure 100 of the lidded resonator assembly 164 and the organic package substrate 168. The organic package substrate 168 may include one or more layers of organic dielectric material with conductive pathways therethrough, and may include electrical pathways (not shown) between the lidded resonator assembly 164 and the RF circuitry die 166. In some embodiments, the organic package substrate 168 may be formed using printed circuit board (PCB) manufacturing processes. In some embodiments, the organic package substrate 168 may include inorganic bridges (e.g., embedded multi-chip interconnect bridges) to couple multiple ones of the RF circuitry dies 166 at the second face 172 (when present), waveguide interconnects, or other interconnects as suitable. The organic package substrate 168 may also include integrated passive devices, such as inductors, as desired, and other discrete passive devices may be coupled (e.g., surface-mounted) to a face of the organic package substrate 168. The conductive contacts 174 may be located at the first face 170 of the organic package substrate 168, and the solder bumps 176 may be formed to be tall enough to permit attachment of the RF FE module 180 to another component via the solder bumps 176 while leaving room for the lidded resonator assembly 164. Of the RF FE modules 180 of FIGS. 18-21, the RF FE module 180 may be the least expensive to manufacture and may involve the least complex manufacturing operations, but may also have the largest form factor and may exhibit the greatest losses (e.g., due to the relatively lossy dielectric material that may be included in the organic package substrate 168).

Figure 19:
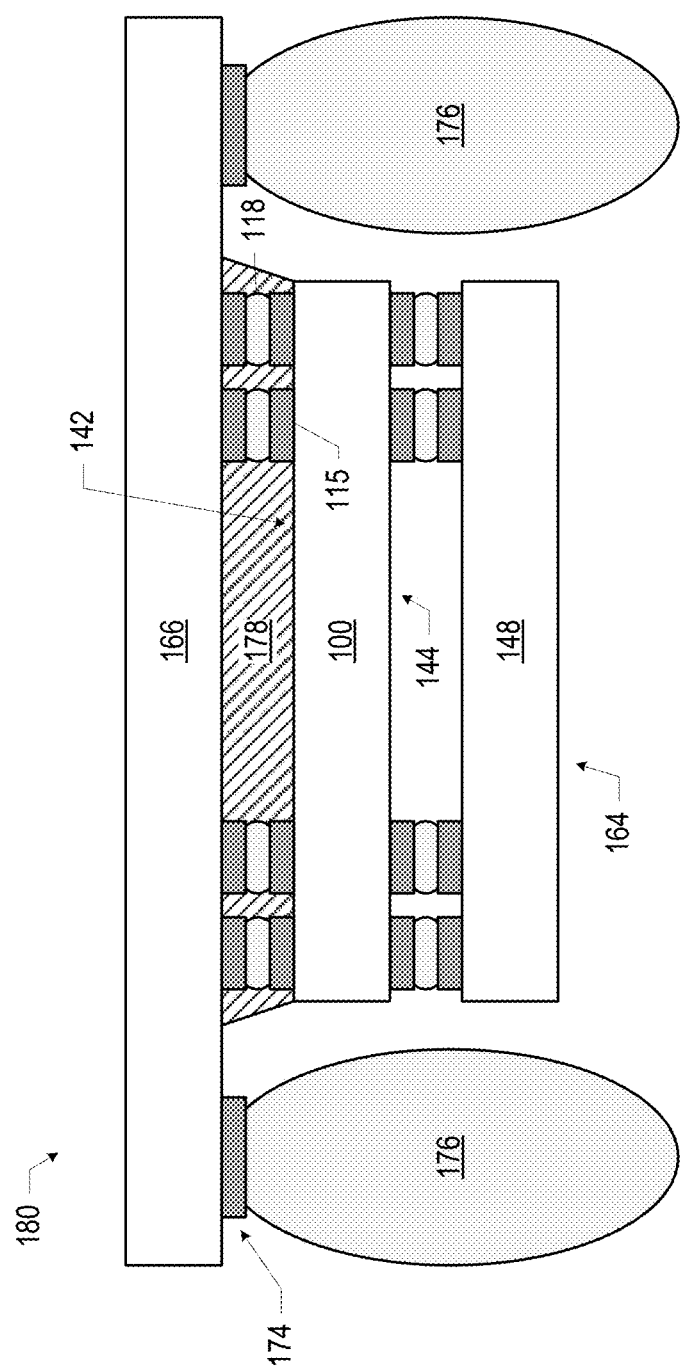

The RF FE module 180 of FIG. 19 shares some characteristics with FIG. 18, but does not include an organic package substrate 168. Instead, the lidded resonator assembly 164 is electrically and mechanically coupled to a face of the RF circuitry die 166 directly. In particular, conductive contacts 115 at the front face 142 of the IC structure 100 of the lidded resonator assembly 164 may be coupled to conductive contacts at the face of the RF circuitry die 166. An underfill material 178 may be disposed between the IC structure 100 of the lidded resonator assembly 164 and the RF circuitry die 166. Conductive contacts 174 may be located at the same face of the RF circuitry die 166, and the solder bumps 176 may be formed to be tall enough to permit attachment of the RF FE module 180 to another component via the solder bumps 176 while leaving room for the lidded resonator assembly 164. Because the RF FE module 180 of FIG. 19 does not include an organic package substrate (like the organic package substrate 168 of the RF FE module 180 of FIG. 18), the RF FE module 180 of FIG. 19 may include more organic interconnect layers 108 in the IC structure 100 of the lidded resonator assembly 164 to achieve a desired amount of routing relative to the RF FE module 180 of FIG. 18, but may be more compact in height (and possibly in lateral directions) than the RF FE module 180 of FIG. 18. However, a larger RF circuitry die 166 may be required in the embodiment of FIG. 19 relative to the embodiment of FIG. 18, which may increase costs, and the use of sufficiently tall solder bumps 176 may add complexity to the manufacturing of the RF FE module 180 of FIG. 19.

Figure 20:
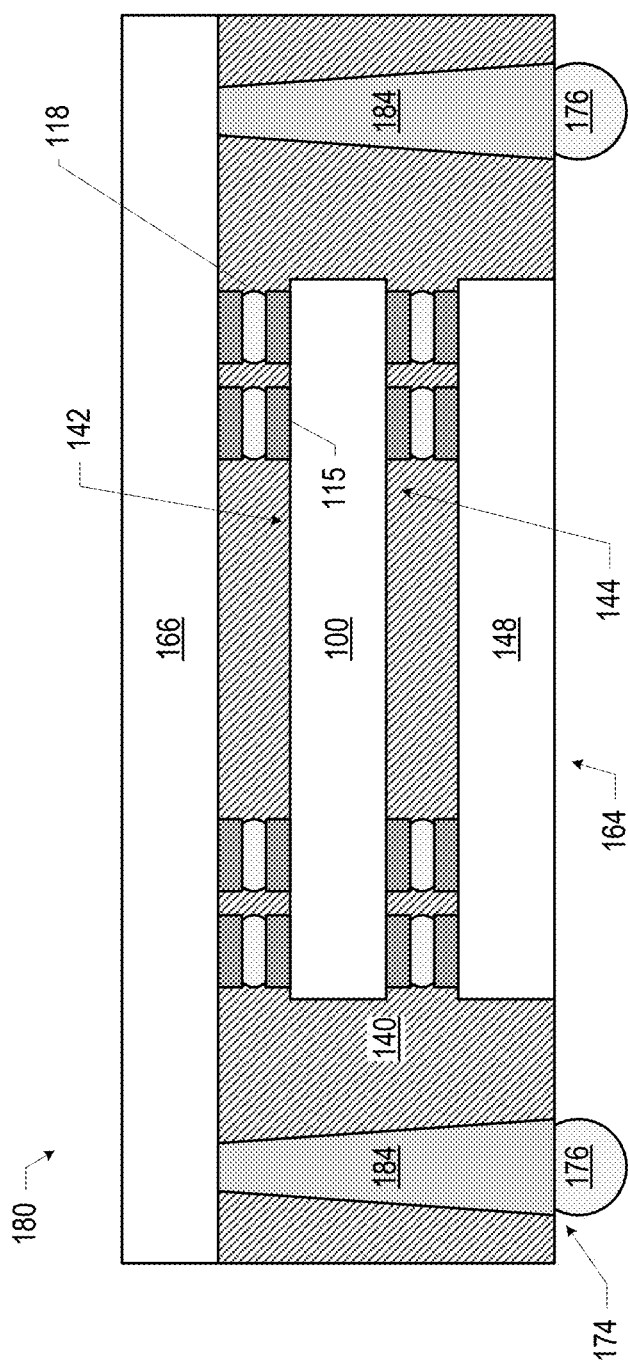

The RF FE module 180 of FIG. 20 shares some characteristics with FIG. 19, but includes a mold compound 140 disposed around the lidded resonator assembly 164 and the RF circuitry die 166, with through-mold vias (TMVs) 184 extending through the mold compound 140 to make electrical contact with conductive contacts (not shown) of the RF circuitry die 166. The exposed surfaces of the TMVs 184 may serve as the conductive contacts 174; solder bumps 176 may be disposed on these conductive contacts 174, and may be used to permit attachment of the RF FE module 180 to another component via the solder bumps 176. Because the RF FE module 180 of FIG. 20 does not include an organic package substrate (like the organic package substrate 168 of the RF FE module 180 of FIG. 18), the RF FE module 180 of FIG. 20 may include more organic interconnect layers 108 in the IC structure 100 of the lidded resonator assembly 164 to achieve a desired amount of routing relative to the RF FE module 180 of FIG. 18, but may be more compact in height (and possibly in lateral directions) than the RF FE module 180 of FIG. 18. However, a larger RF circuitry die 166 may be required in the embodiment of FIG. 19 relative to the embodiment of FIG. 18, which may increase costs. The embodiment of FIG. 20 may achieve a larger density of connections to external components (via the TMVs 184/solder bumps 176), allowing for more signaling, power, and/or ground connections to the RF circuitry die 166 and thus to the lidded resonator assembly 164.

Figure 21:
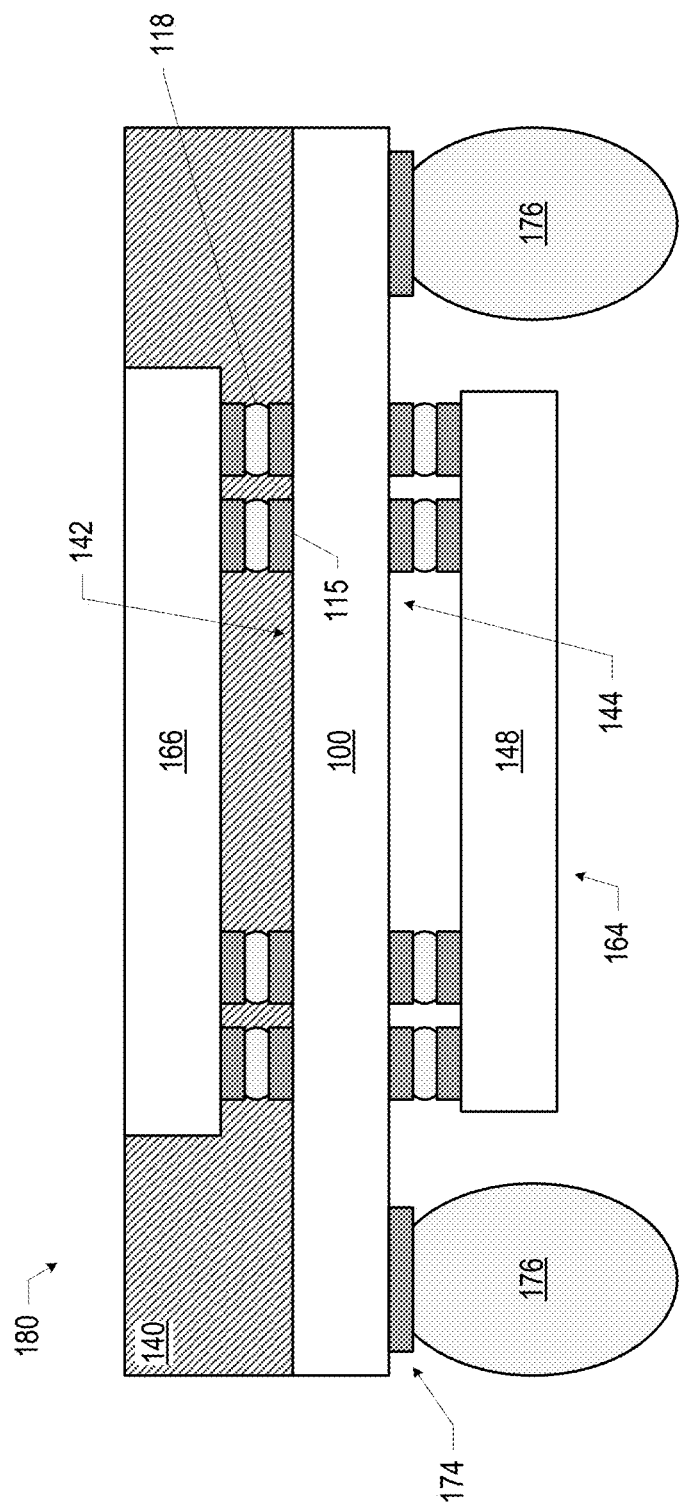

The RF FE module 180 of FIG. 21, like the RF FE modules 180 of FIGS. 19-20, includes a lidded resonator assembly 164 electrically and mechanically coupled to a face of the RF circuitry die 166 directly. In particular, conductive contacts 115 at the front face 142 of the IC structure 100 of the lidded resonator assembly 164 may be coupled to conductive contacts at the face of the RF circuitry die 166. In FIG. 21, however, the conductive contacts 174 are disposed at the back face 144 of the IC structure 100; solder bumps 176 may be formed to be tall enough to permit attachment of the RF FE module 180 to another component via the solder bumps 176 while leaving room for the resonator component 148 of the lidded resonator assembly 164. A mold compound 140 may be disposed around the RF circuitry die 166 at the front face of the IC structure 100; in other embodiments, an underfill material may be present instead of or in addition to a mold compound 140. Because the RF FE module 180 of FIG. 21 does not include an organic package substrate (like the organic package substrate 168 of the RF FE module 180 of FIG. 18), the RF FE module 180 of FIG. 21 may include more organic interconnect layers 108 in the IC structure 100 of the lidded resonator assembly 164 to achieve a desired amount of routing relative to the RF FE module 180 of FIG. 18, but may be more compact in height (and possibly in lateral directions) than the RF FE module 180 of FIG. 18. Further, a smaller RF circuitry die 166 may be utilized in the embodiment of FIG. 21 relative to the embodiments of FIGS. 19 and 20. Although a larger IC structure 100 may be required in the embodiment of FIG. 21 relative to the embodiments of FIGS. 19-20, the costs of manufacturing the IC structure 100 may be less than the costs of manufacturing an equivalently sized RF circuitry die 166. The embodiment of FIG. 21 may also exhibit reduced manufacturing complexity relative to the embodiment of FIG. 19 because "shorter" solder bumps 176 may be used. In some embodiments, an underfill material (not shown) may be present between the edges of the resonator component 148 and the IC structure 100 to provide mechanical support to the resonator component 148; such an "edge glue" may be included in any of the lidded resonator assemblies 164 disclosed herein.

The RF FE modules 180 of FIGS. 18-21 may be manufactured using any suitable techniques. For example, FIGS. 22-25 illustrate stages in an example process of manufacturing the RF FE module 180 of FIG. 18, in accordance with various embodiments. Although the operations of the process of FIGS. 22-25 are illustrated with reference to particular embodiments of the RF FE modules 180 disclosed herein, the process may be used to form any suitable RF FE module 180. Operations are illustrated once each and in a particular order in FIGS. 22-25, but the operations may be reordered and/or repeated as desired (e.g., with different operations performed in parallel when manufacturing multiple electronic components simultaneously).

Figure 22:
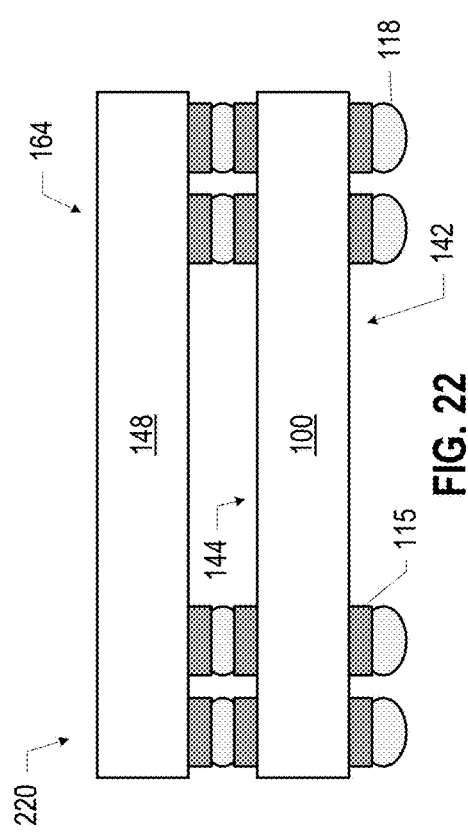
FIGS. 22-25 illustrate stages in an example process of manufacturing the RF FE module of FIG. 18, in accordance with various embodiments.

FIG. 22 is a side, cross-sectional view of an assembly 220 including the lidded resonator assembly 164 having solder 118 on the conductive contacts 115 at the front face 142 of the IC structure 100. The assembly 220 may be formed in accordance with any of the techniques disclosed herein.

Figure 23:
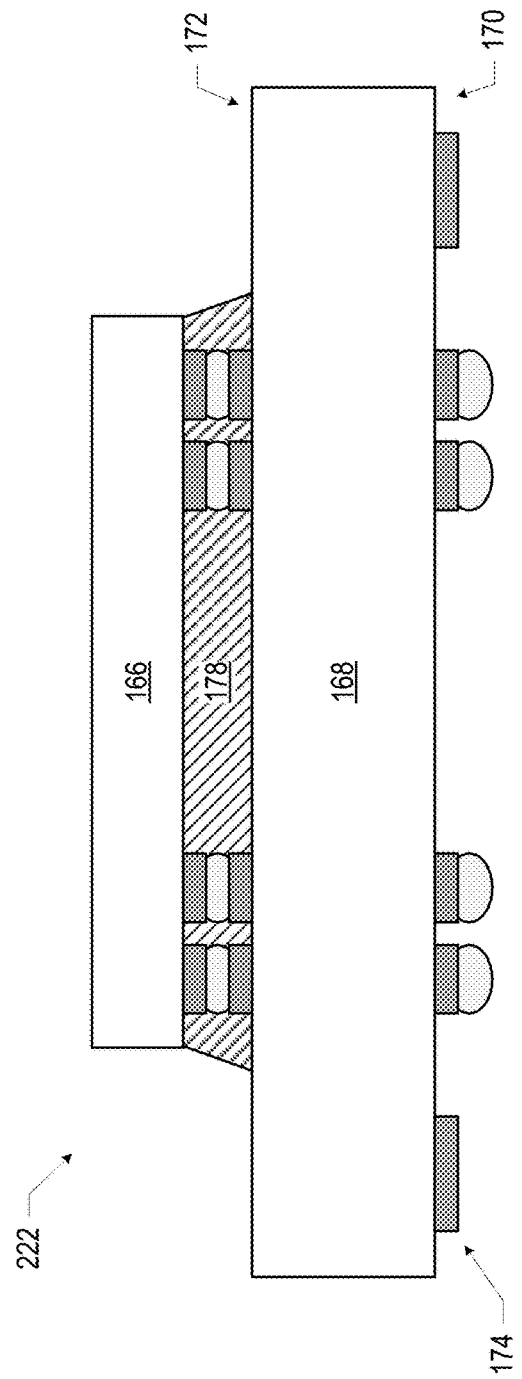

FIG. 23 is a side, cross-sectional view of an assembly 222 including an RF circuitry die 166 coupled to the second face 172 of the organic package substrate 168, with an underfill material 178 therebetween. The assembly 222 may be formed using any suitable packaging technique (e.g., any suitable technique for forming first-level interconnects). In some embodiments, the underfill material 178 may be provided by capillary action, as known in the art.

Figure 24:
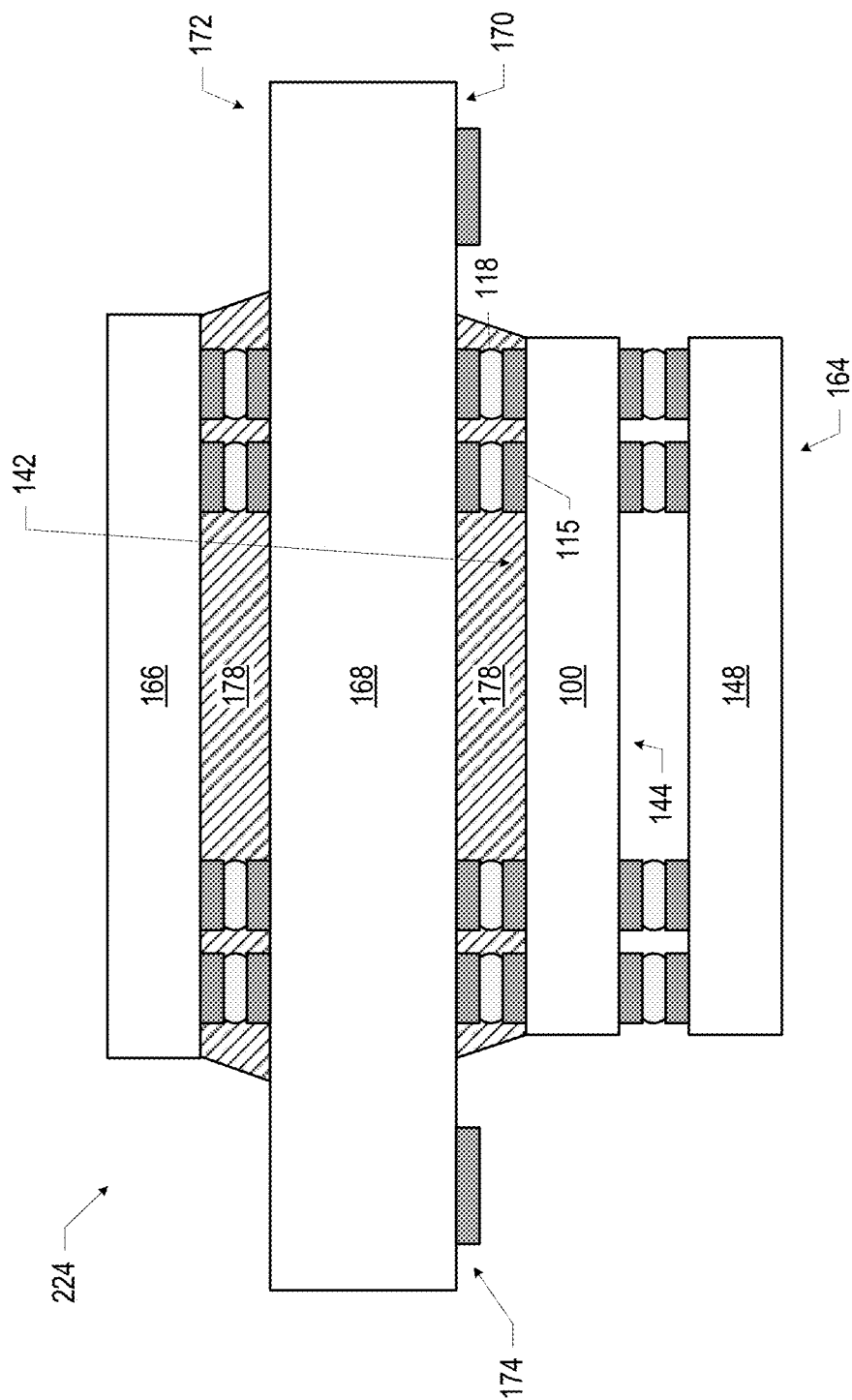

FIG. 24 is a side, cross-sectional view of an assembly 224 subsequent to coupling the assembly 220 (FIG. 22) to the assembly 222 (FIG. 23) so that conductive contacts 115 of the IC structure 100 of the lidded resonator assembly 164 are coupled to conductive contacts at the first face 170 of the organic package substrate 168 via the solder 118, and providing an underfill material between the IC structure 100 and the organic package substrate 168.

Figure 25:
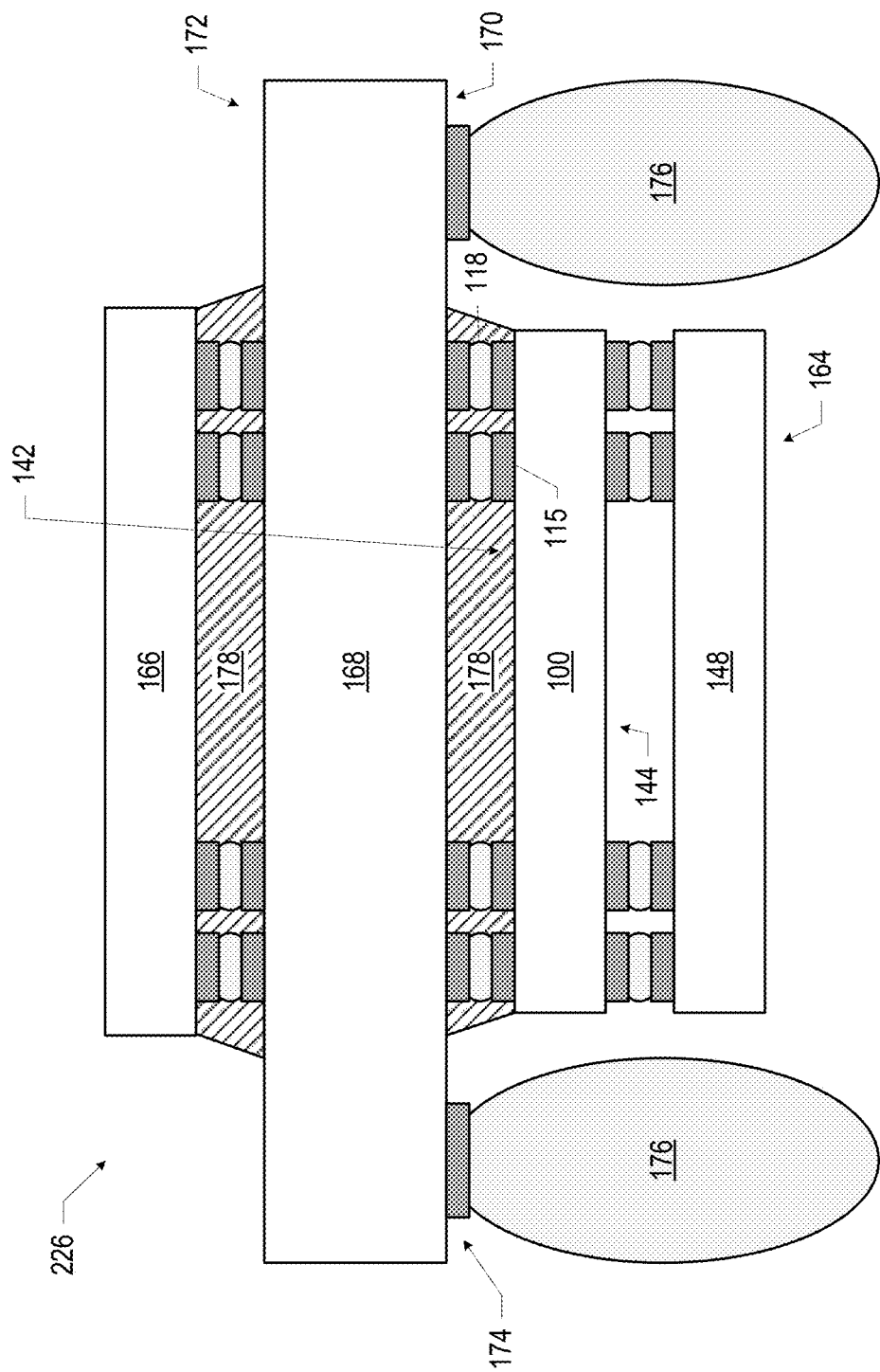

FIG. 25 is a side, cross-sectional view of an assembly 226 subsequent to forming the solder bumps 176 on the conductive contacts 174 at the first face 170 of the organic package substrate 168. The assembly 226 may take the form of the RF FE module 180 of FIG. 18. The RF FE module 180 of FIG. 19 may be manufactured using a process similar to that illustrated in FIGS. 22-25, but omitting the organic package substrate 168 so that the lidded resonator assembly 164 is coupled directly to the RF circuitry die 166.

FIGS. 26-29 illustrate stages in an example process of manufacturing the RF FE module 180 of FIG. 20, in accordance with various embodiments. Although the operations of the process of FIGS. 26-29 are illustrated with reference to particular embodiments of the RF FE modules 180 disclosed herein, the process may be used to form any suitable RF FE module 180. Operations are illustrated once each and in a particular order in FIGS. 26-29, but the operations may be reordered and/or repeated as desired (e.g., with different operations performed in parallel when manufacturing multiple electronic components simultaneously).

Figure 26:
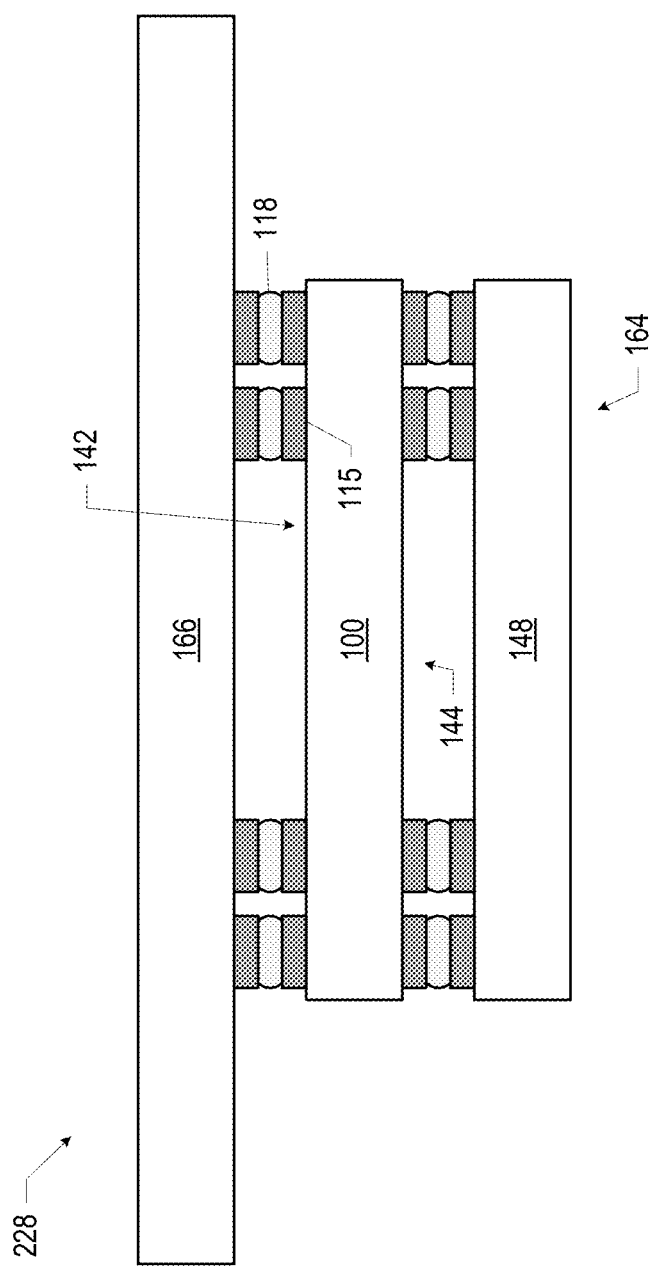
FIGS. 26-29 illustrate stages in an example process of manufacturing the RF FE module of FIG. 20, in accordance with various embodiments.

FIG. 26 is a side, cross-sectional view of an assembly 228 subsequent to coupling the assembly 220 (FIG. 22) to an RF circuitry die 166. In particular, conductive contacts 115 of the IC structure 100 of the lidded resonator assembly 164 are coupled to conductive contacts at a face of the RF circuitry die 166 via the solder 118.

Figure 27:
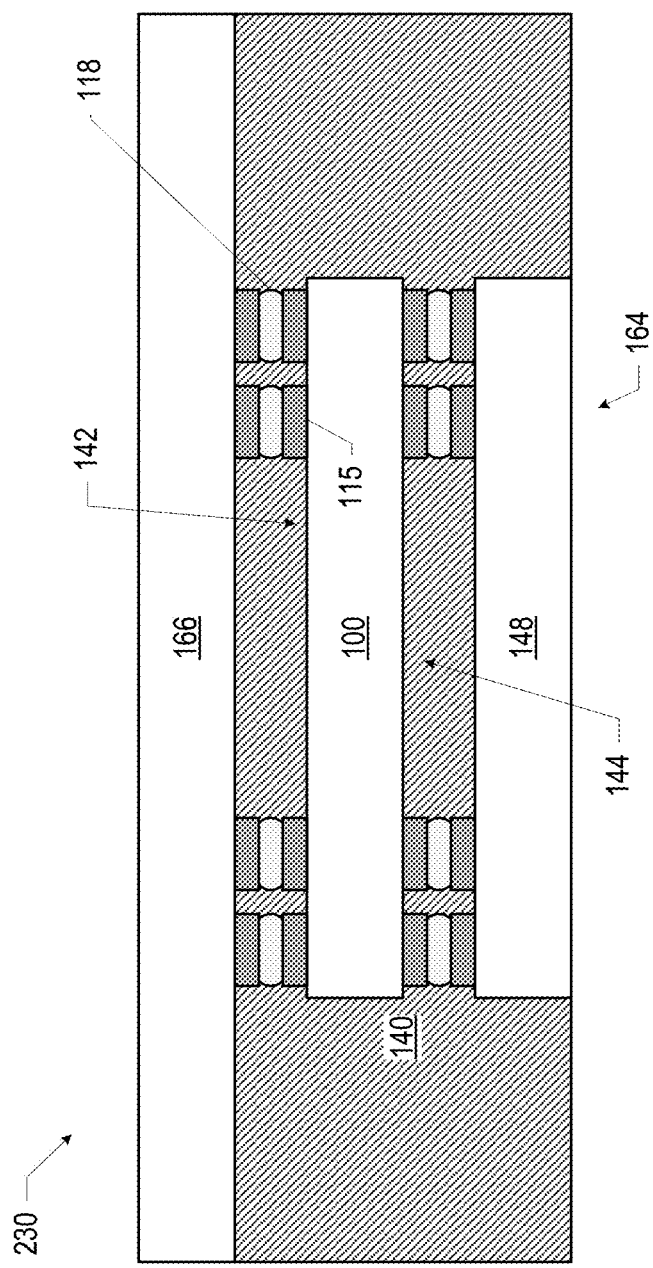

FIG. 27 is a side, cross-sectional view of an assembly 230 subsequent to providing a mold compound 140 around the lidded resonator assembly 164 of the assembly 228 (FIG. 26). In some embodiments, the mold compound 140 may be planarized after deposition in order to expose the "bottom" face of the resonator component 148, as shown.

Figure 28:
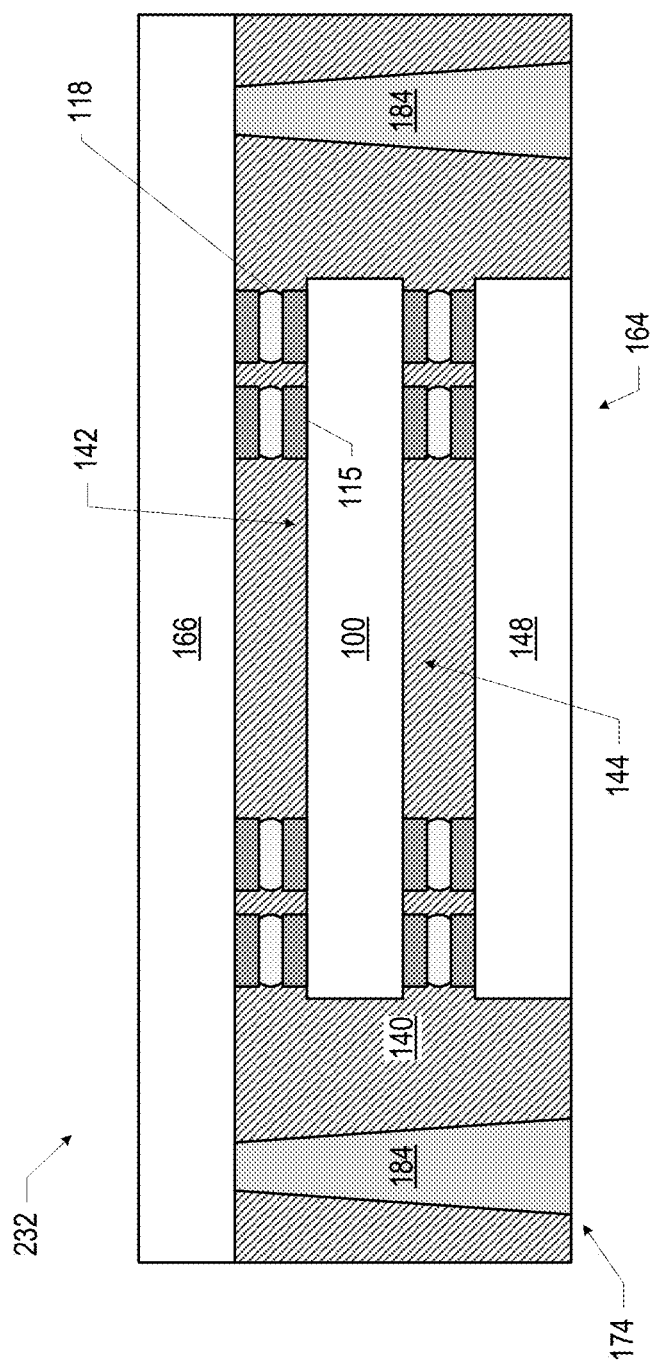

FIG. 28 is a side, cross-sectional view of an assembly 232 subsequent to forming cavities in the mold compound to expose conductive contacts (not shown) at a face of the RF circuitry die 166 of the assembly 230 (FIG. 27) and then filling these cavities with conductive material to form the TMVs 184. In some embodiments, the TMVs 184 may have a tapered shape, narrowing towards the RF circuitry die 166. The exposed faces of the TMVs 184 may provide the conductive contacts 174.

Figure 29:
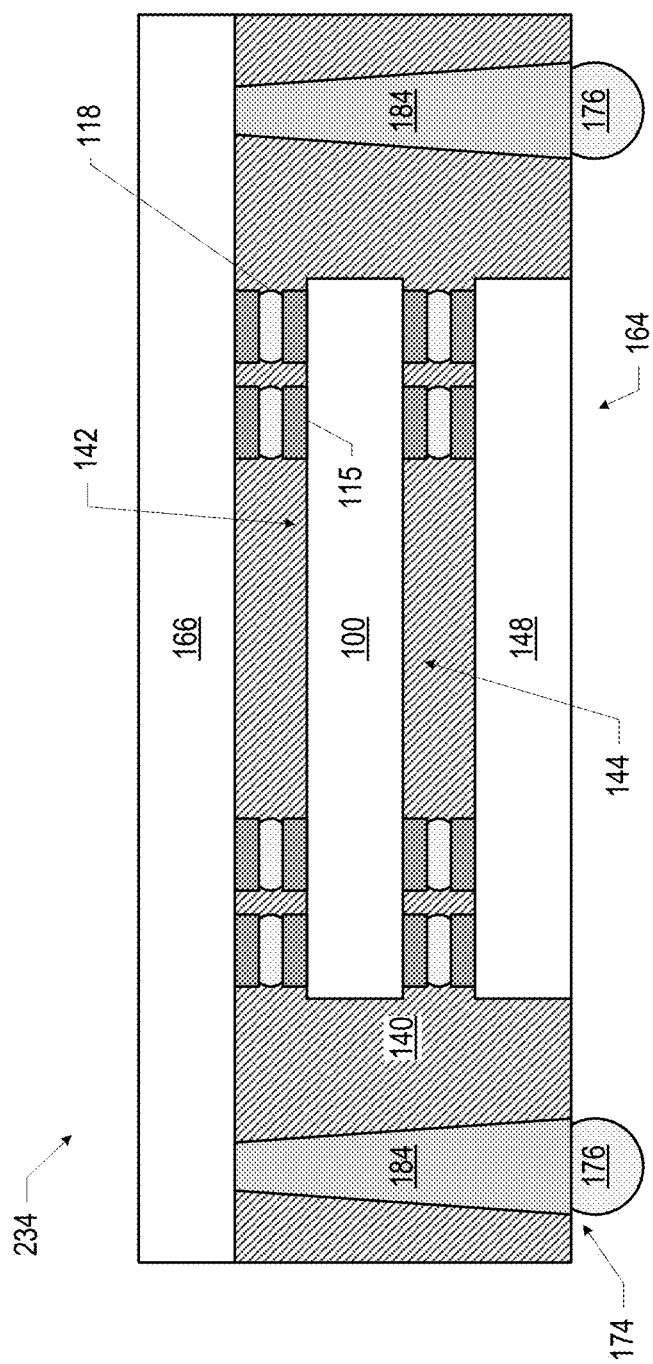

FIG. 29 is a side, cross-sectional view of an assembly 234 subsequent to forming the solder bumps 176 on the conductive contacts 174 of the assembly 232 (FIG. 28). The assembly 234 may take the form of the RF FE module 180 of FIG. 20.

FIGS. 30-33 illustrate stages in an example process of manufacturing the RF FE module 180 of FIG. 21, in accordance with various embodiments. Although the operations of the process of FIGS. 30-33 are illustrated with reference to particular embodiments of the RF FE modules 180 disclosed herein, the process may be used to form any suitable RF FE module 180. Operations are illustrated once each and in a particular order in FIGS. 30-33, but the operations may be reordered and/or repeated as desired (e.g., with different operations performed in parallel when manufacturing multiple electronic components simultaneously).

Figure 30:
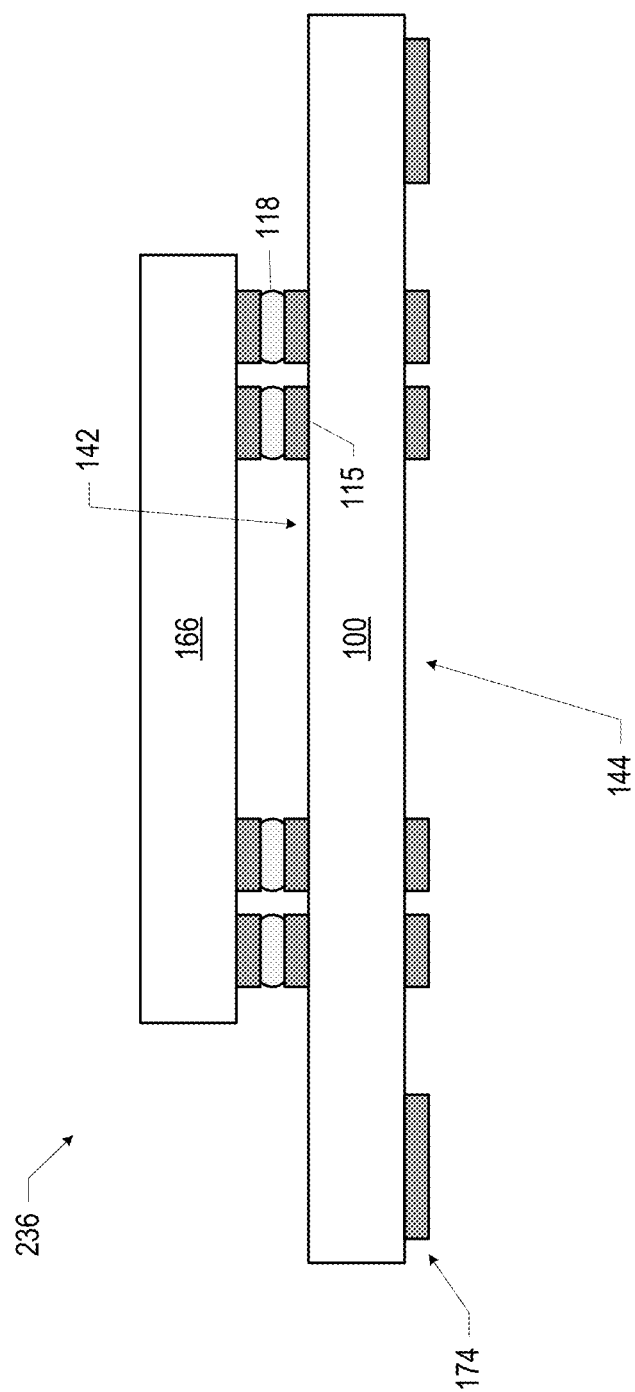
FIGS. 30-33 illustrate stages in an example process of manufacturing the RF FE module of FIG. 21, in accordance with various embodiments.

FIG. 30 is a side, cross-sectional view of an assembly 236 including an IC structure 100 coupled to an RF circuitry die 166. In particular, conductive contacts 115 of the IC structure 100 are coupled to conductive contacts at a face of the RF circuitry die 166 via the solder 118. In the embodiment illustrated in FIG. 30, the conductive contacts 174 are at the back face 144 of the IC structure 100.

Figure 31:
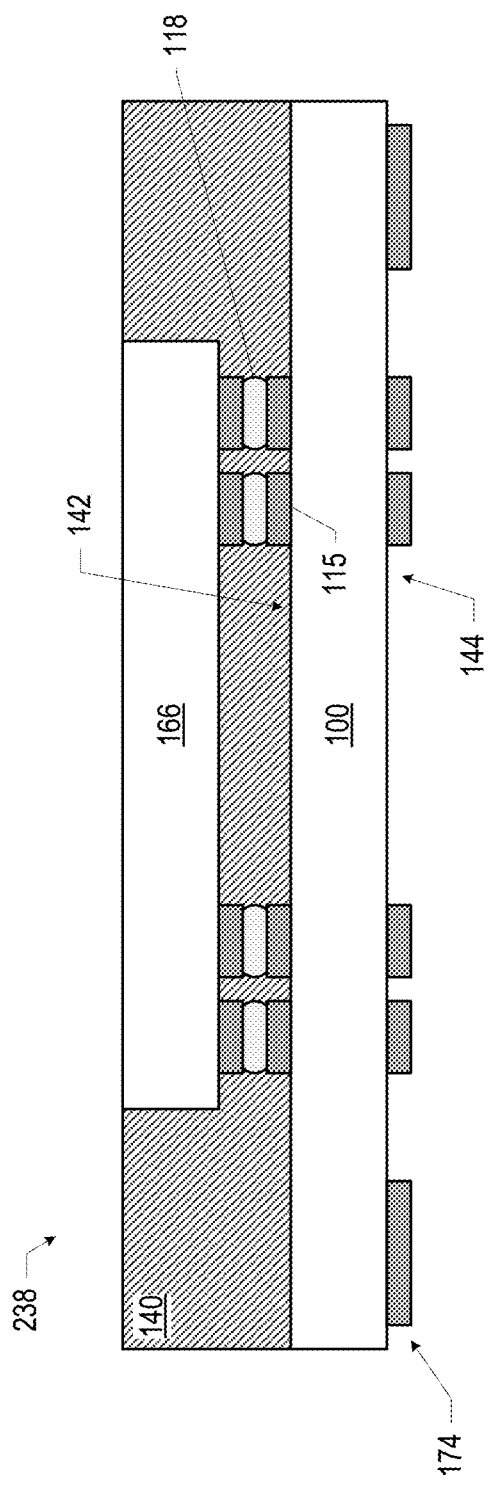

FIG. 31 is a side, cross-sectional view of an assembly 238 subsequent to providing a mold compound 140 around the RF circuitry die 166 of the assembly 236 (FIG. 30). In some embodiments, the mold compound 140 may be planarized after deposition in order to expose the "top" face of the RF circuitry die 166, as shown.

Figure 32:
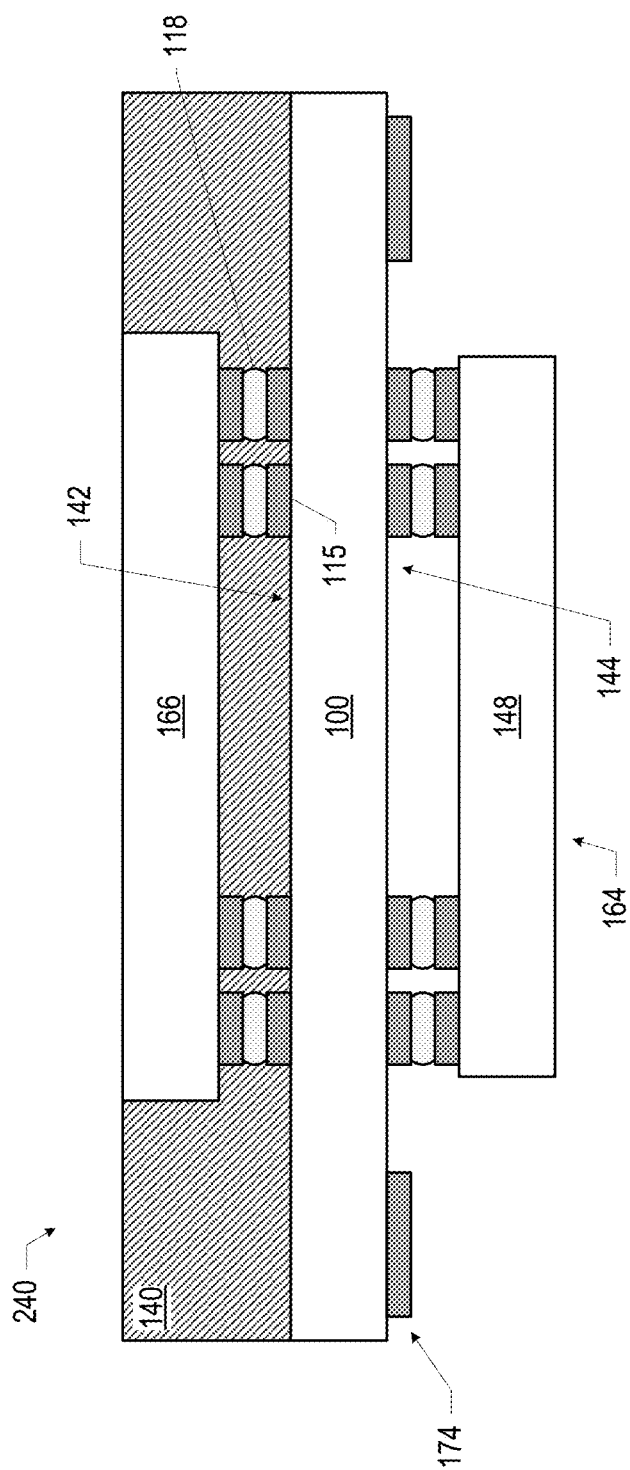

FIG. 32 is a side, cross-sectional view of an assembly 240 subsequent to coupling a resonator component 148 to the back face 144 of the IC structure 100 of the assembly 238 (FIG. 31) so that the resonator component 148 and the IC structure 100 together form a lidded resonator assembly 164 (e.g., with a hermetic seal between the resonator component 148 and the IC structure 100, as discussed above).

Figure 33:
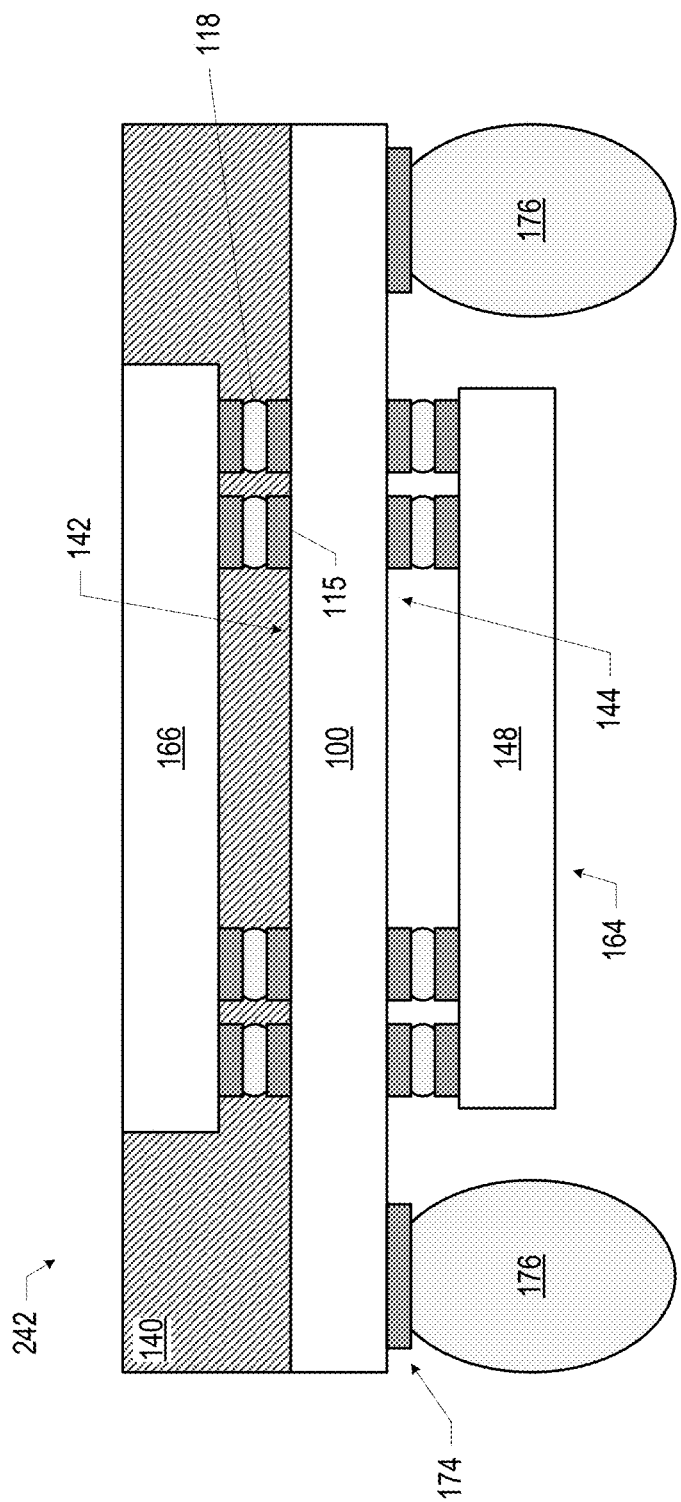

FIG. 33 is a side, cross-sectional view of an assembly 242 subsequent to forming the solder bumps 176, conductive contacts 174 of the assembly 240 (FIG. 32). The assembly 242 may take the form of the RF FE module 180 of FIG. 21.

The IC structures 100, IC assemblies 150, lidded resonator assemblies 164, and/or RF FE modules 180 disclosed herein may include, or may be included in, any suitable electronic component. FIGS. 34-37 illustrate various examples of apparatuses that may include, or be included in, any of the IC structures 100, IC assemblies 150, lidded resonator assemblies 164, and/or RF FE modules 180 disclosed herein, as appropriate.

Figure 34:
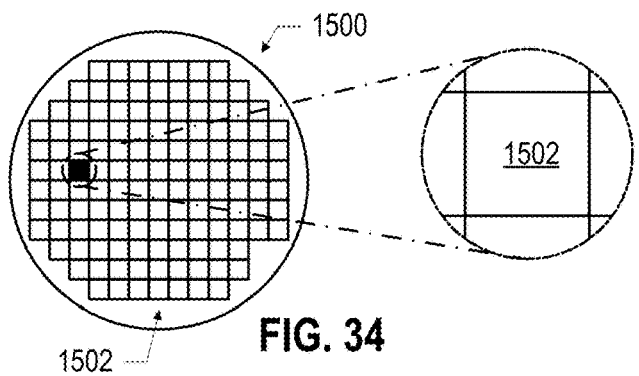
FIG. 34 is a top view of a wafer and dies that may include IC structures, in accordance with any of the embodiments disclosed herein.

FIG. 34 is a top view of a wafer 1500 and dies 1502 that may include one or more IC structures 100, or may be included in any suitable ones of the IC assemblies 150, lidded resonator assemblies 164, and/or RF FE modules 180 disclosed herein. The wafer 1500 may be composed of an inorganic material (e.g., a semiconductor material) and may include one or more dies 1502 having structures formed on a surface of the wafer 1500. Each of the dies 1502 may be a repeating unit of a product that includes any suitable circuitry. After the fabrication of the product is complete, the wafer 1500 may undergo a singulation process in which the dies 1502 are separated from one another to provide discrete "chips" of the semiconductor product. In some embodiments, the die 1502 may include any of the IC structures 100 disclosed herein (e.g., the material of the wafer 1500 may be part of the inorganic substrate 102). In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 36) or other logic that is configured to store information in the memory devices or execute instructions stored in the memory array.

Figure 35:
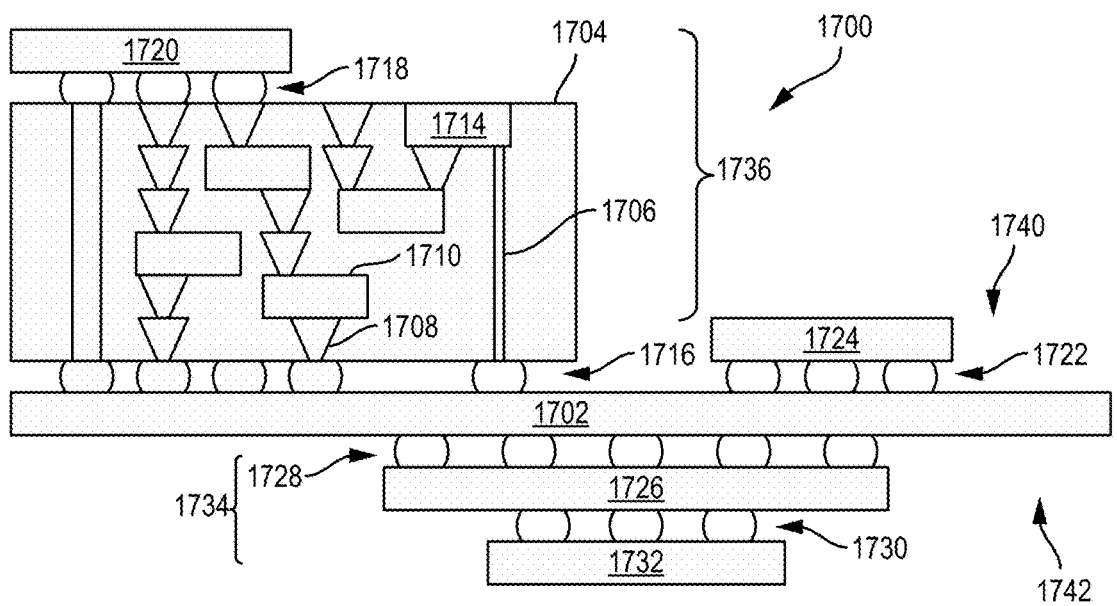
FIG. 35 is a side, cross-sectional view of an IC device assembly that may include IC structures, IC assemblies, lidded resonator assemblies, and/or RF FE modules, in accordance with any of the embodiments disclosed herein.

FIG. 35 is a side, cross-sectional view of an IC device assembly 1700 that may include any of the IC structures 100, IC assemblies 150, lidded resonator assemblies 164, and/or RF FE modules 180 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the IC assemblies 150, lidded resonator assemblies 164, and/or RF FE modules 180 disclosed herein.

In some embodiments, the circuit board 1702 may be a PCB including multiple metal layers separated from one another by layers of organic dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 35 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 35), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 35, multiple IC packages may be coupled to the package interposer 1704; indeed, additional interposers may be coupled to the package interposer 1704. The package interposer 1704 may provide an intervening substrate used to bridge the circuit board 1702 and the IC package 1720. Generally, the package interposer 1704 may spread a connection to a wider pitch or reroute a connection to a different connection. For example, the package interposer 1704 may couple the IC package 1720 to a set of ball grid array conductive contacts of the coupling components 1716 for coupling to the circuit board 1702. In the embodiment illustrated in FIG. 35, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 35 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 36:
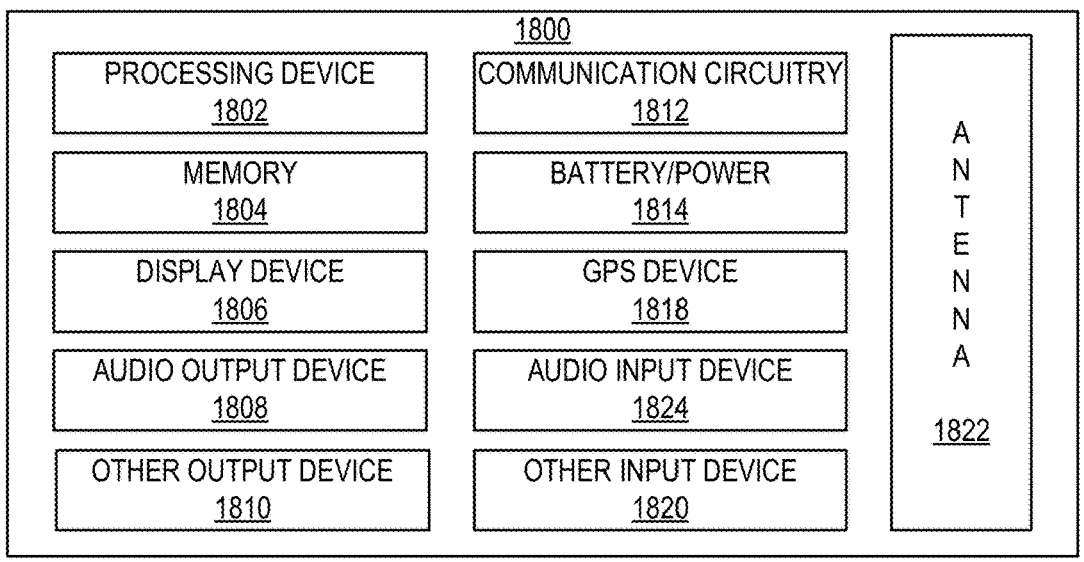
FIG. 36 is a block diagram of an example electrical device that may include IC structures, IC assemblies, lidded resonator assemblies, and/or RF FE modules, in accordance with any of the embodiments disclosed herein.

FIG. 36 is a block diagram of an example electrical device 1800 that may include one or more IC structures 100, IC assemblies 150, lidded resonator assemblies 164, and/or RF FE modules 180, in accordance with any of the embodiments disclosed herein. For example, any suitable ones of the components of the electrical device 1800 may include one or more of the IC device assemblies 1700 or dies 1502 disclosed herein. A number of components are illustrated in FIG. 36 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 36, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include communication circuitry 1812. For example, the communication circuitry 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication circuitry 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication circuitry 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication circuitry 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication circuitry 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication circuitry 1812 may operate in accordance with other wireless protocols in other embodiments. The electrical device 1800 may include an antenna 1822 to facilitate wireless communications and/or to receive other wireless communications (such as AM or FM radio transmissions). The communication circuitry 1812 may include any of the IC structures 100, IC assemblies 150, lidded resonator assemblies 164, and/or RF FE modules 180 disclosed herein.

In some embodiments, the communication circuitry 1812 may manage wired communications, such as electrical, optical, or any other suitable communication protocols (e.g., the Ethernet). As noted above, the communication circuitry 1812 may include multiple communication chips. For instance, a first communication circuitry 1812 may be dedicated to shorter-range wireless communications such as Wi-Fi or Bluetooth, and a second communication circuitry 1812 may be dedicated to longer-range wireless communications such as global positioning system (GPS), EDGE, GPRS, CDMA, WiMAX, LTE, EV-DO, or others. In some embodiments, a first communication circuitry 1812 may be dedicated to wireless communications, and a second communication circuitry 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Figure 37:
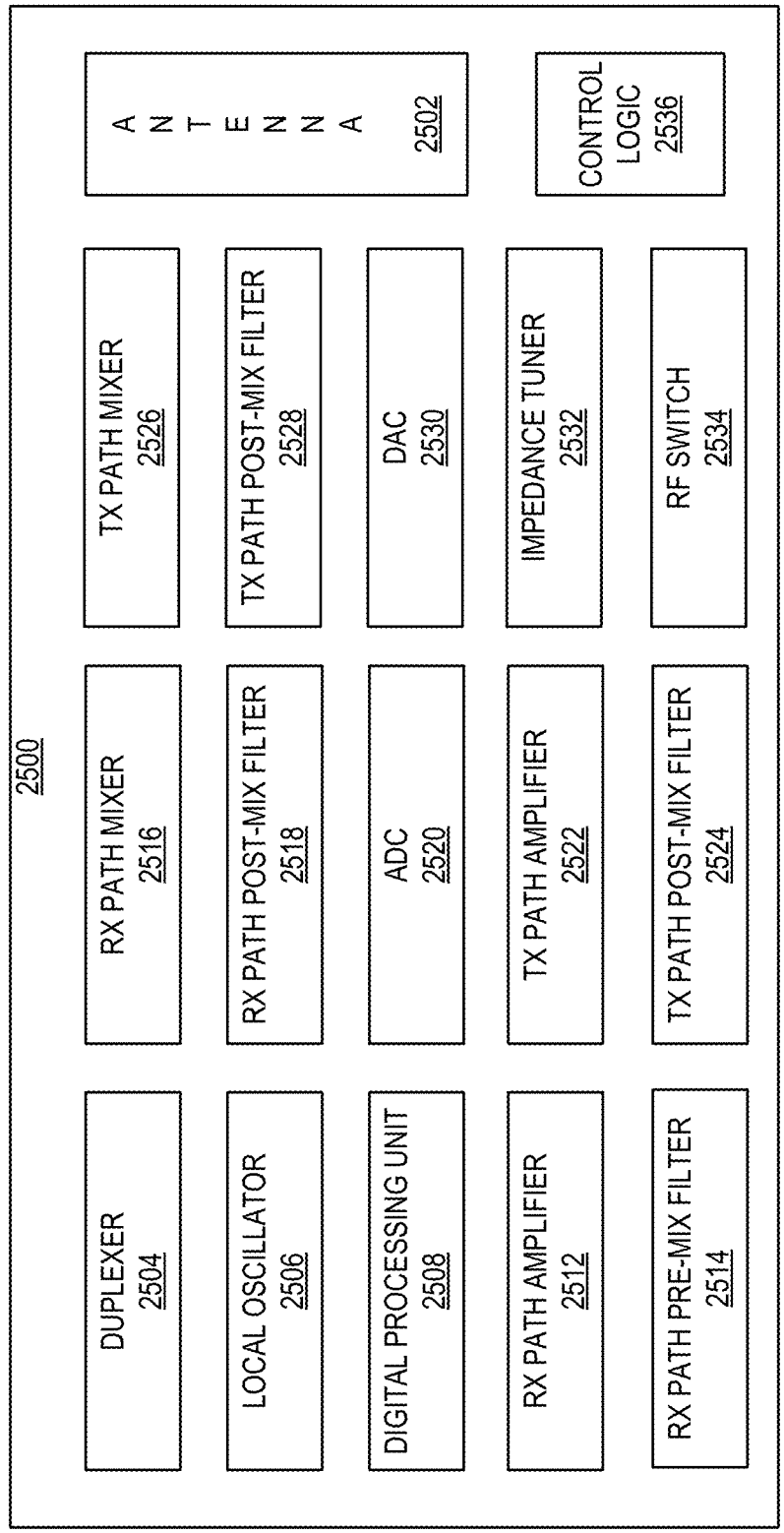
FIG. 37 is a block diagram of an example RF device that may include IC structures, RF assemblies, lidded resonator assemblies, and/or RF FE modules, in accordance with any of the embodiments disclosed herein.

FIG. 37 is a block diagram of an example RF device 2500 that may include any of the IC structures 100, IC assemblies 150, lidded resonator assemblies 164, and/or RF FE modules 180 disclosed herein. For example, any suitable ones of the components of the RF device 2500 may include, or may be included in, an IC assembly 150, a lidded resonator assembly 164, and/or an RF FE module 180, in accordance with any of the embodiments disclosed herein. Any of the components of the RF device 2500 may include, or be included in, an IC assembly 1700 as described with reference to FIG. 35. In some embodiments, the RF device 2500 may be included within any components of the computing device 1800 as described above with reference to FIG. 36 (e.g., the communication circuitry 1812), or may be coupled to any of the components of the electrical device 1800 (e.g., may be coupled to the memory 1804 and/or to the processing device 1802 of the electrical device 1800). In still other embodiments, the RF device 2500 may further include any of the components described above with reference to FIG. 36, such as, but not limited to, the battery/power circuitry 1814, the memory 1804, and various input and output devices as discussed above with reference to FIG. 46.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a base station (BS) or a user equipment (UE) device of any suitable cellular wireless communications technology, such as GSM, WCDMA, or LTE. In a further example, the RF device 2500 may be used as, or in, a BS or a UE device of a millimeter-wave wireless technology such as fifth generation (5G) wireless (e.g., high-frequency/short wavelength spectrum, with frequencies in the range between about 20 GHz and 60 GHz, corresponding to wavelengths in the range between about 5 millimeters and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, corresponding to a wavelength of about 5 cm). For example, the RF device 2500 may be included in a Wi-Fi-enabled device such as a desktop, a laptop, a video game console, a smart phone, a tablet, a smart TV, a digital audio player, a car, a printer, etc. In some implementations, a Wi-Fi-enabled device may be a node (e.g., a smart sensor) in a smart system configured to communicate data with other nodes. In another example, the RF device 2500 may be used for wireless communications using Bluetooth technology (e.g., a frequency band from about 2.4 GHz to about 2.485 GHz, corresponding to a wavelength of about 12 cm). In other embodiments, the RF device 2500 may be used for transmitting and/or receiving RF signals for purposes other than communication (e.g., in an automotive radar system, or in medical applications such as magnetic resonance imaging (MRI)).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 37 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In various embodiments, the RF device 2500 may not include one or more of the components illustrated in FIG. 37, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 37, the RF device 2500 may include an antenna 2502, a duplexer 2504, a local oscillator 2506, and a digital processing unit 2508. As also shown in FIG. 37, the RF device 2500 may include an RX path that may include an RX path amplifier 2512, an RX path pre-mix filter 2514, a RX path mixer 2516, an RX path post-mix filter 2518, and an analog-to-digital converter (ADC) 2520. As further shown in FIG. 37, the RF device 2500 may include a TX path that may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534 (which may include, or be included in, an RF circuitry die 166), and control logic 2536. In various embodiments, the RF device 2500 may include multiple instances of any of the components shown in FIG. 37. In some embodiments, the RX path amplifier 2512, the TX path amplifier 2522, the duplexer 2504, and the RF switch 2534 may be considered to form, or be a part of, an RF FE of the RF device 2500; the components of any RF FE of the RF device 2500 may be part of any of the RF FE modules 180 disclosed herein. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 37) may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 37 as control logic 2536 (providing, for example, an RF FE control interface). The control logic 2536 may be used to enhance control of complex RF system environment, support implementation of envelope tracking techniques, reduce dissipated power, etc.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, e.g., non-overlapping and non-continuous, bands of frequencies, e.g., in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (e.g., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 1802 of FIG. 46, descriptions of which are provided above. The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 37, in some embodiments, the RF device 2500 may further include a memory device (e.g., the memory 1804 described above with reference to FIG. 36) configured to cooperate with the digital processing unit 2508.

Turning to the details of the RX path that may be included in the RF device 2500, the RX path amplifier 2512 may include a low noise amplifier (LNA). An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the RX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-intermediate frequency (IF) receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an IF. IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 37, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to an I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be a low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the RX path post-mix filter 2518.

The ADC 2520 may be configured to convert the mixed RX signals from the RX path mixer 2516 from the analog to the digital domain. The ADC 2520 may be a quadrature ADC that, similar to the RX path mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the RX path mixer 2516 in the RX path and the TX path mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

As noted above, the TX path amplifier 2522 may be a power amplifier configured to amplify the upconverted RF signal before providing it to the antenna 2502 for transmission In various embodiments, any of the RX path pre-mix filter 2514, the RX path post-mix filter 2518, the TX path post-mix filter 2524, and the TX path pre-mix filter 2528 may be implemented as RF filters. In some embodiments, each of such RF filters may include one or more resonators (e.g., AWRs, bulk acoustic resonators (BARs), Lamb wave resonators, and/or contour-wave resonators), arranged in any suitable manner (e.g., in a ladder configuration). Any of these resonators may be part of a resonator component 148 in a lidded resonator assembly 164 and/or an RF FE module 180. Any of the RX path pre-mix filter 2514, the RX path post-mix filter 2518, the TX path post-mix filter 2524, and the TX path pre-mix filter 2528 may include one or more resonator components 148, and thus be may include or be part of a lidded resonator assembly 164 and/or an RF FE module 180. As discussed above with reference to the resonator component 148, an individual resonator (e.g., the resonator 156) of an RF filter may include a layer of a piezoelectric material such as aluminum nitride, enclosed between two or more electrodes or sets of electrodes, with a cavity (e.g., the cavity 160) provided around a portion of each electrode or set of electrodes in order to allow a portion of the piezoelectric material to vibrate during operation of the filter. In some embodiments, an RF filter may be implemented as a plurality of RF filters, or a filter bank. A filter bank may include a plurality of RF resonators that may be coupled to a switch (e.g., the RF switch 2534) configured to selectively switch any one of the plurality of RF resonators on and off (e.g., activate any one of the plurality of RF resonators), in order to achieve desired filtering characteristics of the filter bank (e.g., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g., antenna's impedance changes depending on, e.g., if the antenna is held in a hand, placed on a car roof, etc.

As described above, the RF switch 2534 may be a device configured to route high-frequency signals through transmission paths in order to selectively switch between a plurality of instances of any one of the components shown in FIG. 37 (e.g., to achieve desired behavior and characteristics of the RF device 2500). The RF switch 2534 may be included in an RF circuitry die 166. In some embodiments, an RF switch 2534 may be used to switch between different antennas 2502. In other embodiments, an RF switch may be used to switch between a plurality of RF resonators (e.g., by selectively switching RF resonators on and off) of any of the filters included in the RF device 2500. Typically, an RF system may include a plurality of such RF switches.

The RF device 2500 provides a simplified version and, in further embodiments, other components not specifically shown in FIG. 37 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may include a suitable phase-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

The following paragraphs provide various examples of the embodiments disclosed herein.

Example 1 is an integrated circuit (IC) structure, including: an inorganic die including a conductive pathway from a first face of the inorganic die to a second, opposing face of the inorganic die; organic interconnect layers on the inorganic die, wherein the organic interconnect layers include an organic dielectric and the conductive pathway is in electrical contact with conductive lines and vias of the organic interconnect layers; and an inductor in the organic interconnect layers, wherein the inductor includes conductive lines and vias of the organic interconnect layers.

Example 2 includes the subject matter of Example 1, and further specifies that the inorganic die includes an inorganic substrate, and the inorganic substrate includes glass or a semiconductor material.

Example 3 includes the subject matter of any of Examples 1-2, and further specifies that the inorganic die includes one or more inorganic interconnect layers, and the inorganic interconnect layers include an inorganic dielectric.

Example 4 includes the subject matter of Example 3, and further specifies that the one or more inorganic interconnect layers are between an inorganic substrate of the inorganic die and the organic interconnect layers.

Example 5 includes the subject matter of any of Examples 1-4, and further specifies that the inorganic die includes at least one device layer.

Example 6 includes the subject matter of Example 5, and further specifies that the at least one device layer includes one or more transistors or one or more diodes.

Example 7 includes the subject matter of any of Examples 1-6, and further specifies that the conductive pathway from the first face of the inorganic die to the second face of the inorganic die includes at least one through-substrate via (TSV).

Example 8 includes the subject matter of Example 7, and further specifies that the TSV has a tapered shape, narrowing towards the organic interconnect layers.

Example 9 includes the subject matter of any of Examples 7-8, and further includes: metal pillars, wherein the inorganic die is between the metal pillars and the organic interconnect layers.

Example 10 includes the subject matter of Example 9, and further includes: solder on the metal pillars, wherein the metal pillars are between the solder and the inorganic die.

Example 11 includes the subject matter of any of Examples 1-10, and further specifies that the organic dielectric has a loss tangent that is less than 0.01.

Example 12 includes the subject matter of any of Examples 1-11, and further specifies that the organic dielectric has a loss tangent that is less than 0.001.

Example 13 includes the subject matter of any of Examples 1-12, and further specifies that a thickness of an organic dielectric in at least one of the organic interconnect layers is between 10 microns and 60 microns.

Example 14 includes the subject matter of any of Examples 1-13, and further specifies that a height of conductive lines in at least one of the organic interconnect layers is between 5 microns and 35 microns.

Example 15 includes the subject matter of any of Examples 1-14, and further includes: solder in contact with conductive contacts of the organic interconnect layers, wherein the organic interconnect layers are between the solder and the inorganic die.

Example 16 includes the subject matter of any of Examples 1-15, and further specifies that the organic dielectric has a coefficient of thermal expansion that is less than 20 parts per million per degree Celsius.

Example 17 includes the subject matter of any of Examples 1-16, and further specifies that a number of the organic interconnect layers in the IC structure is between 2 and 8.

Example 18 includes the subject matter of any of Examples 1-17, and further specifies that the organic interconnect layers include a first organic interconnect layer and a second organic interconnect layer, the first organic interconnect layer is between the second organic interconnect layer and the inorganic die, and the first organic interconnect layer has a thickness that is greater than a thickness of the second organic interconnect layer.

Example 19 is a lidded resonator assembly, including: a resonator component; and an IC structure hermetically coupled to the resonator component, wherein the IC structure includes an inorganic die and organic interconnect layers on the inorganic die, the organic interconnect layers include an organic dielectric, and the inorganic die is between the resonator component and the organic interconnect layers.

Example 20 includes the subject matter of Example 19, and further specifies that the resonator component includes acoustic wave resonators, bulk acoustic resonators, Lamb wave resonators, or contour-wave resonators.

Example 21 includes the subject matter of any of Examples 19-20, and further specifies that the IC structure includes a ring on the inorganic die, the resonator component includes a ring, and the rings are coupled together with solder.

Example 22 includes the subject matter of any of Examples 19-21, and further specifies that resonators of the resonator component are in air, in nitrogen gas, or under vacuum.

Example 23 includes the subject matter of any of Examples 19-22, and further specifies that an electrical pathway in the resonator component is electrically coupled to an electrical pathway in the IC structure.

Example 24 includes the subject matter of Example 23, and further specifies that the electrical pathway in the IC structure includes a through-substrate via (TSV).

Example 25 includes the subject matter of any of Examples 19-24, and further specifies that the inorganic die includes an inorganic substrate, and the inorganic substrate includes glass or a semiconductor material.

Example 26 includes the subject matter of any of Examples 19-25, and further specifies that the inorganic die includes inorganic interconnect layers, and the inorganic interconnect layers include an inorganic dielectric.

Example 27 includes the subject matter of Example 26, and further specifies that the inorganic interconnect layers are between an inorganic substrate of the inorganic die and the organic interconnect layers.

Example 28 includes the subject matter of any of Examples 19-27, and further specifies that the inorganic die includes at least one device layer.

Example 29 includes the subject matter of Example 28, and further specifies that the at least one device layer includes one or more transistors or one or more diodes.

Example 30 includes the subject matter of any of Examples 19-29, and further specifies that a through-substrate via (TSV) of the inorganic die is in electrical contact with a conductive pathway of the organic interconnect layers.

Example 31 includes the subject matter of any of Examples 19-30, and further specifies that the organic dielectric has a loss tangent that is less than 0.01.

Example 32 includes the subject matter of any of Examples 19-31, and further specifies that the organic dielectric has a loss tangent that is less than 0.001.

Example 33 includes the subject matter of any of Examples 19-32, and further specifies that a thickness of an organic dielectric in at least one of the organic interconnect layers is between 10 microns and 60 microns.

Example 34 includes the subject matter of any of Examples 19-33, and further specifies that a height of conductive lines in at least one of the organic interconnect layers is between 5 microns and 35 microns.

Example 35 includes the subject matter of any of Examples 19-34, and further specifies that the organic dielectric has a coefficient of thermal expansion that is less than 20 parts per million per degree Celsius.

Example 36 includes the subject matter of any of Examples 19-35, and further specifies that a number of the organic interconnect layers in the IC structure is between 2 and 8.

Example 37 includes the subject matter of any of Examples 19-36, and further specifies that the organic interconnect layers include a first organic interconnect layer and a second organic interconnect layer, the first organic interconnect layer is between the second organic interconnect layer and the inorganic die, and the first organic interconnect layer has a thickness that is greater than a thickness of the second organic interconnect layer.

Example 38 is a radio frequency (RF) front-end (FE) module, including: a lidded resonator assembly including an IC structure having an inorganic die proximate to a first face of the IC structure and organic interconnect layers proximate to a second, opposing face of the IC structure, wherein the lidded resonator assembly also includes a resonator component hermetically coupled to the inorganic die; and an RF circuitry die electrically coupled to the lidded resonator assembly.

Example 39 includes the subject matter of Example 38, and further specifies that the resonator component includes acoustic wave resonators, bulk acoustic resonators, Lamb wave resonators, or contour-wave resonators.

Example 40 includes the subject matter of any of Examples 38-39, and further specifies that the IC structure includes a ring on the inorganic die, the resonator component includes a ring, and the rings are coupled together with solder.

Example 41 includes the subject matter of any of Examples 38-40, and further specifies that resonators of the resonator component are in air, in nitrogen gas, or under vacuum.

Example 42 includes the subject matter of any of Examples 38-41, and further specifies that an electrical pathway in the resonator component is electrically coupled to an electrical pathway in the IC structure.

Example 43 includes the subject matter of Example 42, and further specifies that the electrical pathway in the IC structure includes a through-substrate via (TSV).

Example 44 includes the subject matter of any of Examples 38-43, and further specifies that the inorganic die includes an inorganic substrate, and the inorganic substrate includes glass or a semiconductor material.

Example 45 includes the subject matter of any of Examples 38-44, and further specifies that the inorganic die includes one or more inorganic interconnect layers, and the inorganic interconnect layers include an inorganic dielectric.

Example 46 includes the subject matter of Example 45, and further specifies that the one or more inorganic interconnect layers are between an inorganic substrate of the inorganic die and the organic interconnect layers.

Example 47 includes the subject matter of any of Examples 38-46, and further specifies that the inorganic die includes at least one device layer.

Example 48 includes the subject matter of Example 47, and further specifies that the at least one device layer includes one or more transistors or one or more diodes.

Example 49 includes the subject matter of any of Examples 38-48, and further specifies that a through-substrate via (TSV) of the inorganic die is in electrical contact with a conductive pathway of the organic interconnect layers.

Example 50 includes the subject matter of any of Examples 38-49, and further specifies that an organic dielectric of the organic interconnect layers has a loss tangent that is less than 0.01.

Example 51 includes the subject matter of any of Examples 38-50, and further specifies that an organic dielectric of the organic interconnect layers has a loss tangent that is less than 0.001.

Example 52 includes the subject matter of any of Examples 38-51, and further specifies that a thickness of an organic dielectric in at least one of the organic interconnect layers is between 10 microns and 60 microns.

Example 53 includes the subject matter of any of Examples 38-52, and further specifies that a height of conductive lines in at least one of the organic interconnect layers is between 5 microns and 35 microns.

Example 54 includes the subject matter of any of Examples 38-53, and further specifies that an organic dielectric of the organic interconnect layers has a coefficient of thermal expansion that is less than 20 parts per million per degree Celsius.

Example 55 includes the subject matter of any of Examples 38-54, and further specifies that a number of the organic interconnect layers between the inorganic die and the RF circuitry die is between 2 and 8.

Example 56 includes the subject matter of any of Examples 38-55, and further specifies that the organic interconnect layers include a first organic interconnect layer and a second organic interconnect layer, the first organic interconnect layer is between the second organic interconnect layer and the inorganic die, and the first organic interconnect layer has a thickness that is greater than a thickness of the second organic interconnect layer.

Example 57 includes the subject matter of any of Examples 38-56, and further specifies that the RF circuitry die includes power amplifier circuitry, switching circuitry, driver circuitry, or matching network circuitry.

Example 58 includes the subject matter of any of Examples 38-57, and further specifies that the organic interconnect layers include an inductor, and the inductor includes conductive lines and vias of the organic interconnect layers.

Example 59 includes the subject matter of any of Examples 38-58, and further specifies that the RF circuitry die is electrically coupled to the lidded resonator assembly by a package substrate.

Example 60 includes the subject matter of Example 59, and further specifies that the RF circuitry die is coupled to a first face of the package substrate, and the lidded resonator assembly is coupled to a second, opposing face of the package substrate.

Example 61 includes the subject matter of any of Examples 59-60, and further includes: solder interconnects coupled to the package substrate, wherein a height of the solder interconnects is greater than a height of the lidded resonator assembly.

Example 62 includes the subject matter of any of Examples 59-61, and further specifies that the package substrate is an organic package substrate.

Example 63 includes the subject matter of any of Examples 59-62, and further specifies that one or more inductors, resistors, transmission lines, or capacitors is included in the organic package substrate.

Example 64 includes the subject matter of any of Examples 38-58, and further specifies that the RF circuitry die is electrically coupled to the lidded resonator assembly by solder in contact with the RF circuitry die and the lidded resonator assembly.

Example 65 includes the subject matter of Example 64, and further specifies that the solder is in contact with conductive contacts of the organic interconnect layers.

Example 66 includes the subject matter of any of Examples 64-65, and further includes: underfill material around the solder.

Example 67 includes the subject matter of any of Examples 64-66, and further includes: solder interconnects coupled to the RF circuitry die, wherein a height of the solder interconnects is greater than a height of the lidded resonator assembly.

Example 68 includes the subject matter of Example 67, and further specifies that the solder interconnects are coupled to a same face of the RF circuitry die as the lidded resonator assembly.

Example 69 includes the subject matter of any of Examples 64-65, and further includes: a mold material around the lidded resonator assembly.

Example 70 includes the subject matter of Example 69, and further includes: through-mold vias (TMVs) through the mold material and in contact with conductive contacts at a face of the RF circuitry die.

Example 71 includes the subject matter of Example 70, and further specifies that the TMVs include solder.

Example 72 includes the subject matter of any of Examples 69-71, and further specifies that the lidded resonator assembly is coupled to a face of the RF circuitry die, and the mold material contacts the same face of the RF circuitry die.

Example 73 includes the subject matter of any of Examples 64-65, and further includes: a mold material around the RF circuitry die and in contact with a face of the lidded resonator assembly proximate to the organic interconnect layers.

Example 74 includes the subject matter of Example 73, and further includes: solder interconnects coupled to the first face of the IC structure, wherein a height of the solder interconnects is greater than a height of the resonator component.

Example 75 includes the subject matter of any of Examples 38-74, and further specifies that the lidded resonator assembly includes underfill material between the resonator component and the IC structure.

Example 76 is a communication device, including: a circuit board; and the RF FE module of any of claims 38-75, coupled to the circuit board.

Example 77 includes the subject matter of Example 76, and further specifies that the circuit board is a motherboard.

Example 78 includes the subject matter of any of Examples 76-77, and further includes: an antenna communicatively coupled to the RF circuitry die.

Example 79 includes the subject matter of any of Examples 76-78, and further specifies that the communication device is a wearable device, a handheld device, or a laptop computing device.

Example 80 is a method of manufacturing including any of the methods of manufacturing disclosed herein.

The invention claimed is:

1. A method for fabricating an integrated circuit (IC) structure, comprising:
    forming organic interconnect layers over an inorganic interconnect substrate; and
    forming passive components in the organic interconnect layers, wherein:
        the organic interconnect layers comprise a plurality of conductive metal layers through an organic dielectric material,
        the organic dielectric material is not photodefinable,
        the plurality of conductive metal layers comprises electrical pathways, and
        the passive components are electrically coupled to the electrical pathways.

2. The method of claim 1, further comprising:
    forming at least one via in the organic interconnect layers electrically coupling at least two layers in the plurality of conductive metal layers.

3. The method of claim 2, wherein forming the at least one via includes:
    depositing a layer of conductive metal on the organic dielectric material,
    performing a lithographic via process to pattern the deposited layer of conductive metal into the at least one via, and
    depositing the organic dielectric material around the at least one via.

4. The method of claim 1, further comprising:
    disposing a solder resist material over the organic interconnect layers;
    exposing a conductive contact in the organic interconnect layers through an opening in the solder resist material; and
    disposing solder into the opening in electrical contact with the conductive contact.

5. The method of claim 4, wherein disposing the solder resist material comprises laminating or spraying the solder resist material over the organic interconnect layers.

6. The method of claim 1, wherein the inorganic interconnect substrate comprises frontside interconnect layers disposed on a surface of the inorganic interconnect substrate, and the organic interconnect layers are formed over the frontside interconnect layers.

7. The method of claim 1, wherein the passive components include an inductor.

8. The method of claim 1, wherein the inorganic interconnect substrate comprises at least one device layer.

9. The method of claim 1, wherein the organic interconnect layers are formed over a barrier material, such that the barrier material is between the inorganic substrate and the organic interconnect layers.

10. The method of claim 1, further comprising coupling an IC die to the organic interconnect layers.

11. The method of claim 1, wherein the IC structure comprises a radio frequency (RF) IC die.

12. The method of claim 10, wherein coupling the IC die comprises soldering the IC die to conductive contacts on the organic interconnect layers.

13. A method for fabricating an RF front-end (FE) module, comprising:
    coupling a resonator component to a ring-shaped conductive contact on a back side of an IC die to form a lidded resonator assembly;
    coupling an RF circuitry die to a first face of a package substrate;
    adding a first underfill between the RF circuitry die and the first face of the package substrate;
    coupling the lidded resonator assembly to a second face of the package substrate, the second face being opposite to the first face; and
    adding a second underfill between the IC die and the second face of the package substrate.

14. The method of claim 13, wherein the IC die comprises organic interconnect layers over inorganic interconnect layers.

15. The method of claim 13, wherein coupling the lidded resonator assembly to the second face of the package substrate comprises soldering conductive contacts of the IC die to the second face of the package, wherein the conductive contacts are on a front side of the IC die, the front side being opposite to the back side.

16. The method of claim 15, wherein the second underfill is between the front face of the IC die and the second face of the package around the conductive contacts.

17. A method for fabricating an RF FE module, comprising:
    coupling a resonator component to a ring-shaped conductive contact on a back side of an IC die to form a lidded resonator assembly;
    coupling the lidded resonator assembly to a face of an RF circuitry die;
    disposing mold compound around the lidded resonator assembly;
    planarizing the mold compound to expose a face of the lidded resonator assembly opposite to the RF circuit die; and
    forming through-mold vias (TMVs) in the mold compound to expose conductive contacts on the face of the RF circuitry die.

18. The method of claim 17, wherein the RF circuitry die comprises organic interconnect layers over inorganic interconnect layers.

19. The method of claim 17, wherein coupling the lidded resonator assembly to the face of the RF circuitry die comprises soldering the conductive contacts of the IC die to the RF circuitry die, wherein the conductive contacts are on a front side of the IC die, the front side being opposite to the back side.

20. The method of claim 17, wherein forming the TMVs comprises forming cavities in the mold compound and filling the cavities with conductive material.

* * * * *

UNITED STATES PATENT AND TRADEMARK OFFICE
CERTIFICATE OF CORRECTION

| | |
|---|---|
| PATENT NO. | : 11,621,192 B2 |
| APPLICATION NO. | : 17/338296 |
| DATED | : April 4, 2023 |
| INVENTOR(S) | : Aleksandar Aleksov et al. |

It is certified that error appears in the above-identified patent and that said Letters Patent is hereby corrected as shown below:

On the Title Page

In Item (57), under "ABSTRACT", in Column 2, Line 13, delete "the passive" and insert -- The passive --, therefor.

Signed and Sealed this
Ninth Day of May, 2023

*Katherine Kelly Vidal*

Katherine Kelly Vidal
*Director of the United States Patent and Trademark Office*